US009608391B2

(12) United States Patent
Little et al.

(10) Patent No.: US 9,608,391 B2
(45) Date of Patent: *Mar. 28, 2017

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Shuo-Hsiu Hsu, New Taipei (TW); Chih-Kai Yang, New Taipei (TW); An-Jen Yang, Irvine, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/289,980

(22) Filed: Oct. 11, 2016

(65) Prior Publication Data

US 2017/0033519 A1 Feb. 2, 2017

Related U.S. Application Data

(63) Continuation of application No. 14/497,205, filed on Sep. 25, 2014, now Pat. No. 9,472,910, which is a (Continued)

(51) Int. Cl.
*H01R 24/00* (2011.01)
*H01R 24/60* (2011.01)
(Continued)

(52) U.S. Cl.
CPC ........... *H01R 24/60* (2013.01); *H01R 12/724* (2013.01); *H01R 13/642* (2013.01);
(Continued)

(58) Field of Classification Search
CPC .................. H01R 23/7073; H01R 23/7005
(Continued)

(56) References Cited

U.S. PATENT DOCUMENTS 6,755,689 B2 6/2004 Zhang et al.
7,758,379 B2 7/2010 Chen
(Continued)

FOREIGN PATENT DOCUMENTS

CM CN201868687 U 6/2011
CN 2454802 Y 10/2001
(Continued)

OTHER PUBLICATIONS

Universal Serial Bus Type-C Cable and Connector Specification Revision 0.7 Working Draft Jan. xx, 2014, p. 13-14,20-21,33,38.
(Continued)

*Primary Examiner* — Phuongchi T Nguyen
(74) *Attorney, Agent, or Firm* — Wei Te Chung; Ming Chieh Chang

(57) ABSTRACT

A receptacle includes an insulating housing including a base and a mating tongue, upper contacts and lower contacts, a metallic shell and a shielding plate. The contacts include plate contacting sections exposed upon the mating tongue. The shielding plate is disposed in the mating tongue and the base and isolated from the upper and lower contacts. The metallic shell is retained on the base and surrounding the mating tongue to define a mating port which is inserted with a plug connector in either of two insertion orientations. The front sides of the shielding plate is exposed to the front side of the mating tongue and the lateral sides of the shielding plates is exposed to the corresponding lateral sides of the mating tongue for protection under an improper angular mating of the plug connector.

17 Claims, 43 Drawing Sheets

Related U.S. Application Data continuation-in-part of application No. 14/477,889, filed on Sep. 5, 2014, and a continuation-in-part of application No. 14/454,737, filed on Aug. 8, 2014, and a continuation-in-part of application No. 14/337,180, filed on Jul. 21, 2014, now Pat. No. 9,318,853.

(60) Provisional application No. 61/926,270, filed on Jan. 11, 2014, provisional application No. 61/919,681, filed on Dec. 20, 2013, provisional application No. 61/917,363, filed on Dec. 18, 2013, provisional application No. 61/949,232, filed on Mar. 6, 2014, provisional application No. 61/916,147, filed on Dec. 14, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013.

(51) Int. Cl.
*H01R 12/72* (2011.01)
*H01R 13/642* (2006.01)
*H01R 13/6582* (2011.01)
*H01R 24/28* (2011.01)
*H01R 107/00* (2006.01)

(52) U.S. Cl.
CPC ......... *H01R 13/6582* (2013.01); *H01R 24/28* (2013.01); *H01R 2107/00* (2013.01)

(58) Field of Classification Search
USPC .................. 439/660, 626, 374, 377, 79, 733
See application file for complete search history.

(56) References Cited

U.S. PATENT DOCUMENTS

| | | | |
|---|---|---|---|
| 8,087,944 B2 | 1/2012 | Kumamoto et al. | |
| 8,517,773 B2 | 8/2013 | Lee et al. | |
| 8,968,031 B2 | 3/2015 | Simmel et al. | |
| 9,281,642 B1 | 3/2016 | Tseng et al. | |
| 9,300,095 B2 | 3/2016 | Lin et al. | |
| 9,312,641 B2 | 4/2016 | Wang et al. | |
| 9,318,853 B2 * | 4/2016 | Little | H01R 13/6658 |
| 9,318,856 B2 | 4/2016 | MacDougall et al. | |
| 9,379,499 B2 | 6/2016 | Miyoshi et al. | |
| 9,472,910 B2 * | 10/2016 | Little | H01R 24/60 |
| 2007/0049100 A1 | 3/2007 | Tsai | |
| 2009/0156027 A1 | 6/2009 | Chen | |
| 2013/0095702 A1 | 4/2013 | Golko et al. | |
| 2014/0024257 A1 | 1/2014 | Castillo et al. | |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |
| 2016/0118752 A1 | 4/2016 | Guo et al. | |

FOREIGN PATENT DOCUMENTS

| | | |
|---|---|---|
| CN | 2728006 Y | 9/2005 |
| CN | 201029143 Y | 2/2008 |
| CN | 201107821 Y | 8/2008 |
| CN | 201230066 Y | 4/2009 |
| CN | 101573840 A | 11/2009 |
| CN | 201741935 U | 2/2011 |
| CN | 201741937 U | 2/2011 |
| CN | 201868687 U | 6/2011 |
| CN | 102437482 A | 5/2012 |
| CN | 102544812 A | 7/2012 |
| CN | 202423735 | 9/2012 |
| CN | 202737282 | 2/2013 |
| CN | 103081253 A | 5/2013 |
| CN | 203242848 U | 10/2013 |
| CN | 103427263 A | 12/2013 |
| CN | 203481540 U | 3/2014 |
| TW | M288035 | 2/2006 |
| TW | M357077 | 5/2009 |
| TW | M391213 | 10/2010 |
| TW | I427870 | 6/2011 |
| TW | M414692 | 10/2011 |
| TW | M443957 | 12/2012 |
| TW | M453995 | 5/2013 |
| TW | M454654 | 6/2013 |
| TW | M471688 | 2/2014 |
| WO | WO2009147791 | 12/2009 |
| WO | WO2013/020359 | 2/2013 |

OTHER PUBLICATIONS

USB Type-C Specification 0.9c05—20140518, p. 24-44,47,53-64,84-86.
Universal Serial Bus Type-C Cable and Connector Specification Revision 1.0 Aug. 11, 2014, p. 18-19,28-48,51,55,58,59-63,65-67,70,93,96-99.107,110-113.

* cited by examiner

41

FLIPPABLE ELECTRICAL CONNECTOR

CROSS REFERENCE TO RELATED APPLICATIONS

This application is a continuation of Ser. No. 14/497,205 filed on Sep. 25, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

US Patent Publication No. 20130095702A1 discloses a dual orientation plug connector, which has a connector tab with first and second major opposing sides and a plurality of electrical contacts carried by the connector tab. The plurality of contacts may include a first set of external contacts formed at the first major side and a second set of external contacts formed at the second major side. The first plurality of contacts may be symmetrically spaced with the second plurality of contacts and the connector tab may be shaped to have 180 degree symmetry so that it can be inserted and operatively coupled to a corresponding receptacle connector in either of two insertion orientations.

A receptacle connector corresponds to the plug connector. A sensing circuit in the receptacle or the electronic device in which the receptacle connector is housed can detect the orientation of the contacts and switch internal connections to the contacts in the connector jack as appropriate. When the contacts are more, the sensing circuit is more complicated, which will waste software switches or hardware switches.

Hence, a new and simple electrical plug connector and the complementary receptacle connector are desired.

SUMMARY OF THE INVENTION

Accordingly, the object of the present invention is to provide a receptacle connector comprises: an insulating housing comprising a base and a mating tongue extending from the base; a plurality of upper contacts and a plurality of lower contacts, the contacts comprising plate contacting section exposed upon opposite upper and lower surfaces of the mating tongue; and a shielding plate disposed in the mating tongue and the base and isolated from the upper and lower contacts; and a metallic shell retained on the base and surrounding the mating tongue to define a mating port which is inserted with a plug connector in either of two insertion orientations, among the metallic shell and the mating tongue; wherein the mating tongue defines two opposite lateral sides and a front side connecting with front ends of the two lateral sides thereof, the shielding plate defines corresponding lateral sides and corresponding front side thereof, the front sides of the shielding plate exposed to the front side of the mating tongue and the lateral sides of the shielding plates exposed to the corresponding lateral sides of the mating tongue for protection under an improper angular mating of the plug connector.

Other objects, advantages and novel features of the invention will become more apparent from the following detailed description when taken in conjunction with the accompanying drawings.

BRIEF DESCRIPTION OF THE DRAWINGS

FIG. 3 is an exploded perspective view of the receptacle connector of FIG. 27;

DETAILED DESCRIPTION OF THE PREFERRED EMBODIMENT

Reference will now be made in detail to the preferred embodiment of the present invention.

Referring to FIGS. 1-11 showing a first embodiment of the present invention which includes a plug connector 200 connecting with a cable 27 and a receptacle connector 300 mounted upon a mother board. The plug connector 200 may be shaped to have 180 degree symmetry so that it can be inserted and operatively coupled to the receptacle connector 300 in either of two insertion orientations.

Figure 1:
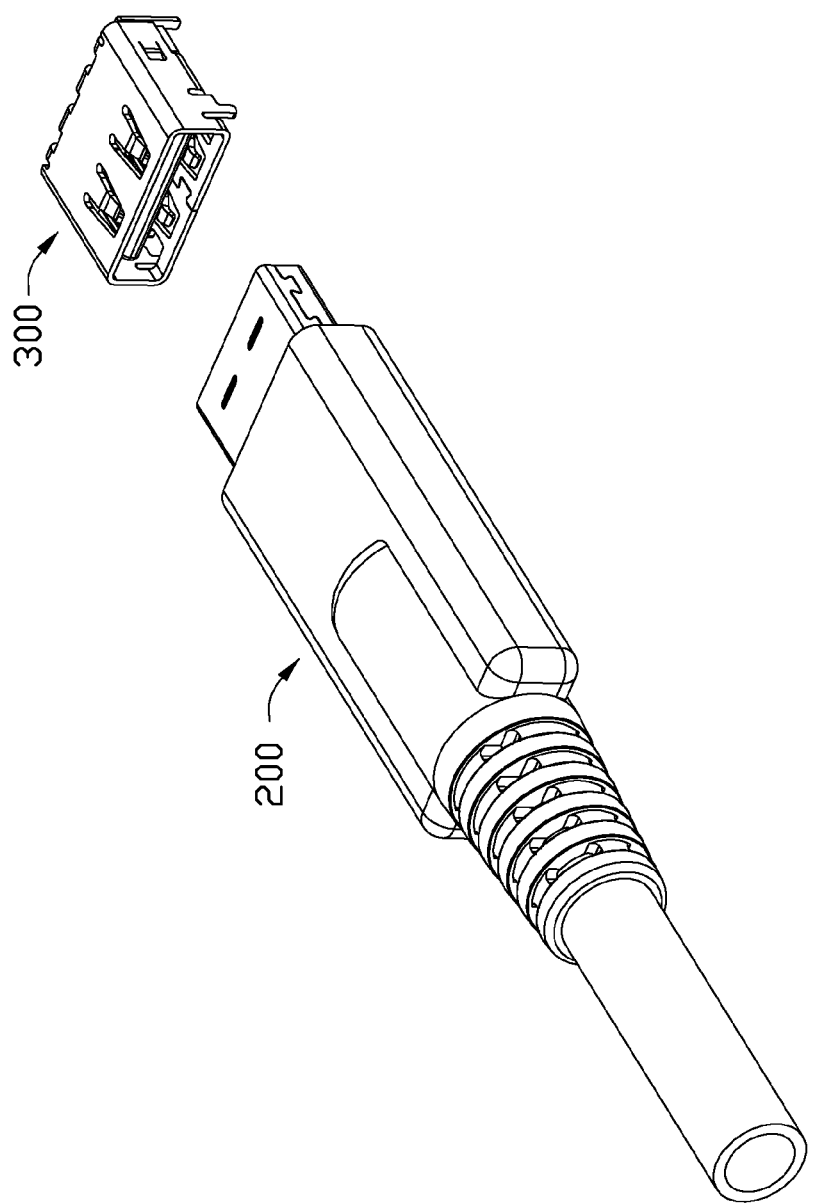
FIG. 1 is a perspective view of a plug connector and a corresponding receptacle connector according to a first embodiment of the present invention.
Figure 2:
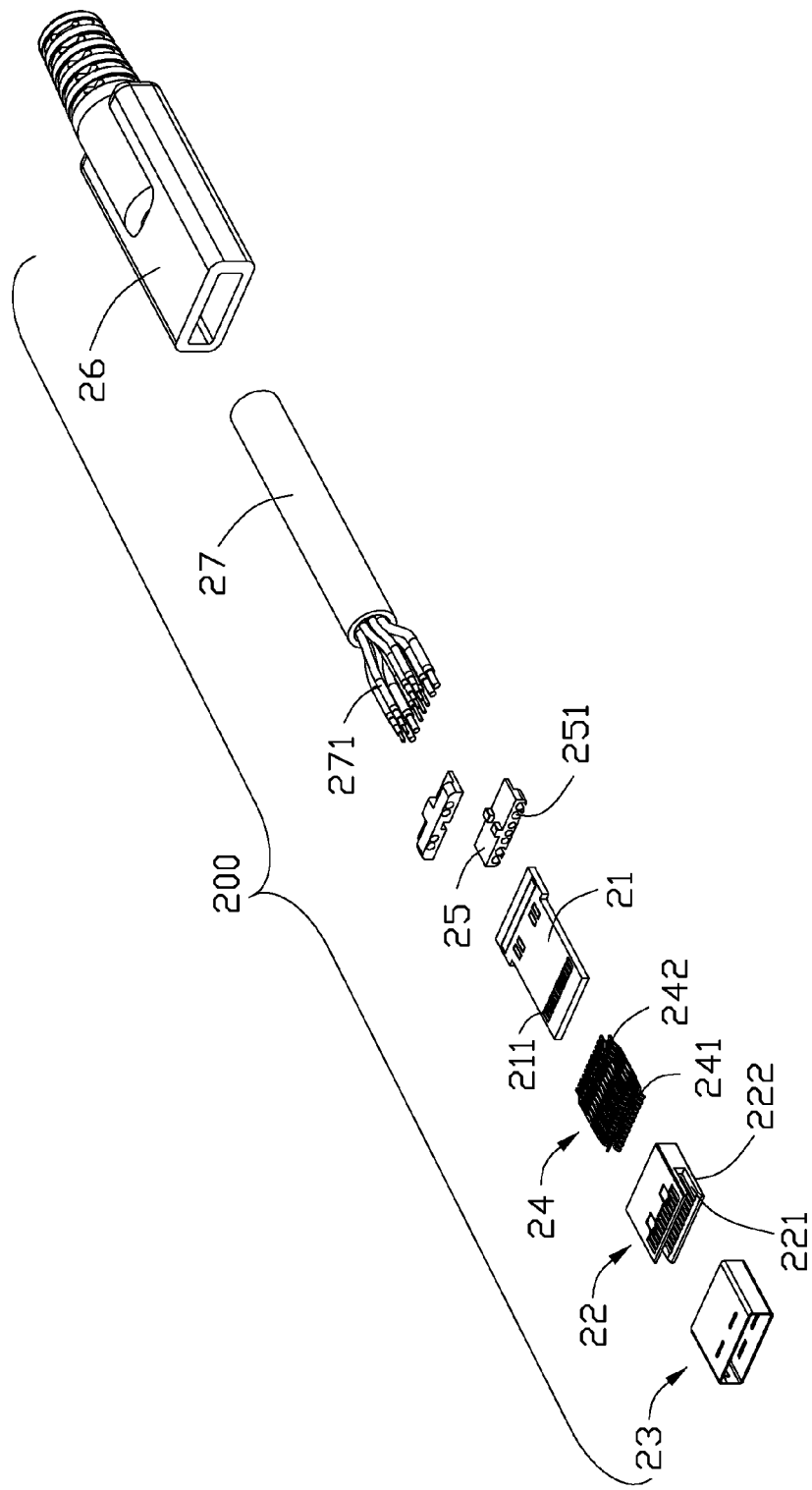
FIG. 2 is an exploded perspective view of the plug connector of FIG. 1.
Figure 3:
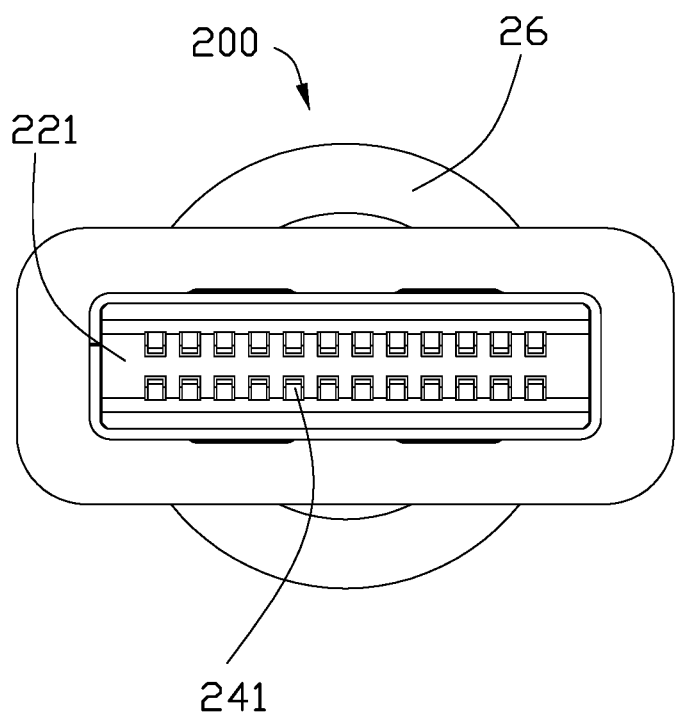
FIG. 3 is a front elevational view of plug connector of FIG. 1.
Figure 4:
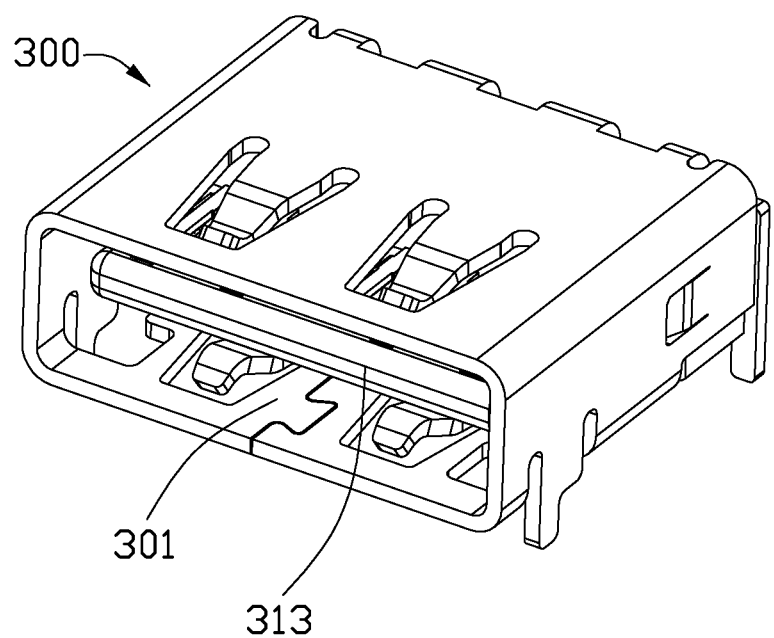
FIG. 4 is a perspective view of the receptacle connector of FIG. 1.

Referring to FIGS. 1-3, the plug connector 200 including a paddle card 21 with circuit pads 211 on two opposite surfaces. An insulative housing 22 located in front of the paddle card 21, is enclosed in a metallic shell 23 and defines a center slot 221 between two sidewalls 222 each equipped with a plurality of contacts 24, each contact 24 having a front contacting section 241 extending into the center slot 221 and a rear mounting section 242 mechanically and electrically connected to a front region of the corresponding circuit pads 211, respectively. The cable 27 extends rearwardly from the paddle card 21 and includes therein a plurality of conductive wires 271 respectively connected to a rear region of the paddle card 21. A pair of spacers 25 is located behind the paddle card 21 and defines a plurality of through holes 251 into which the corresponding wires 271 extend, respectively. An insulating cover 26 is overmolded on the shell 23, the paddle card 21 and the cable 27 to finalize the whole plug connector 200.

Referring to FIGS. 4-11, the receptacle connector 300 includes a terminal module assembly 31 essentially composed of an upper terminal module 311 and a lower terminal module 312 commonly sandwiching a middle tongue 313 therebetween in a vertical direction. A plurality of upper contacts 321 are insert molded within the an upper insulator 331 to form the upper terminal module 311, a plurality of lower contacts 322 are insert molded within a lower insulator 332 to form the lower terminal module 312, and a shielding/grounding plate 34 is insert molded within a middle insulator 333 to form the middle tongue 313, wherein the upper contact 321 includes a front contacting section 3211 seated upon one surface of the middle tongue 313 and a rear mounting section 3212 mounted upon the corresponding circuit pad of the mother board (not shown), and the lower contact 322 includes a front contacting section 3221 seated upon the other surface of the middle tongue 313 and a rear mounting section 3222 mounted upon the corresponding circuit pad of the mother board (not shown). The lower contacts 322 are categorized with short signal contacts 322a and longer power/grounding contacts 322b, middle sections 3227 of signal contacts 322a bend toward to adjacent power/grounding contacts 322b to enlarger distance between two adjacent signal contacts.

Figure 7:
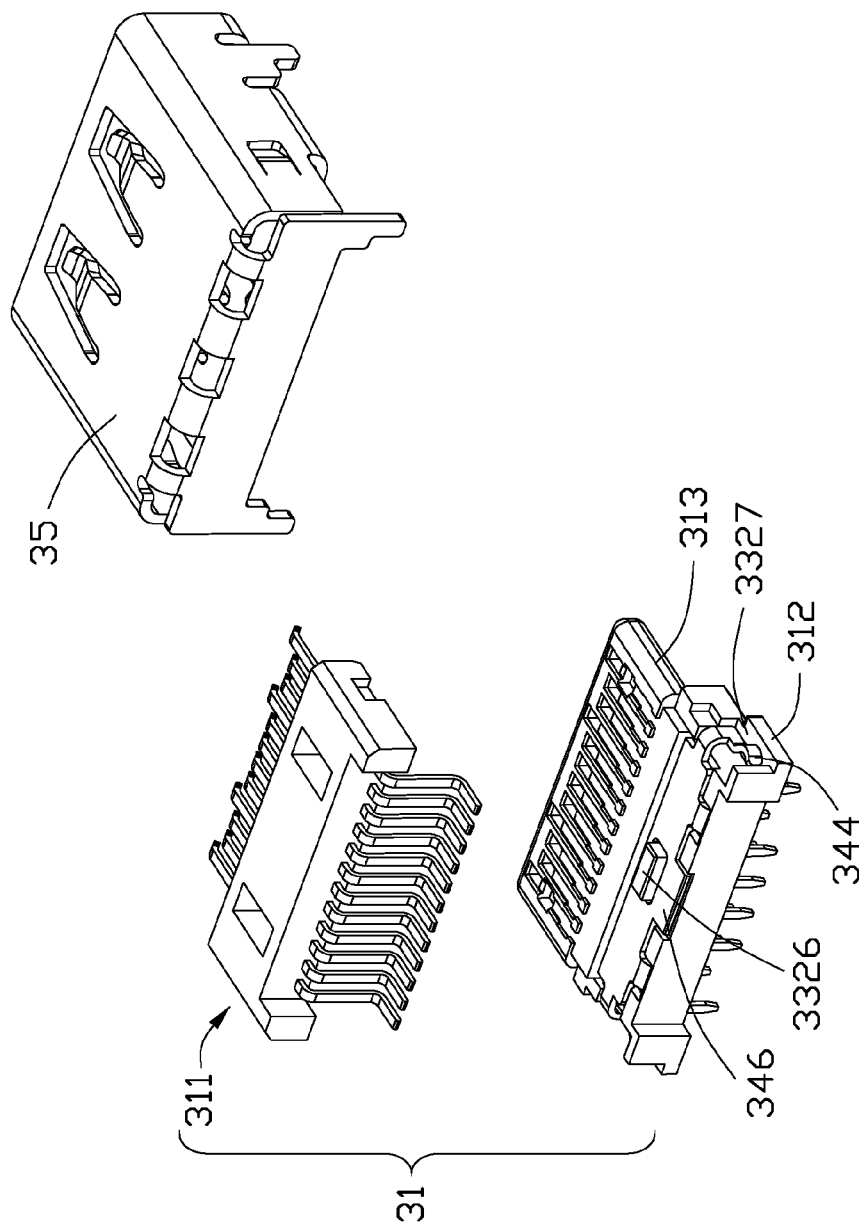
FIG. 7 is a perspective view of the receptacle connector with the partially assembled housing of the receptacle connector of FIG. 4.

The shielding/grounding plate 34 include a front region 340 embedded in the insulator 333 of the mating tongue 313 and a rear region 348 exposed behind the insulator 333 of the mating tongue 313. The rear region 348 defines an opening 345 in a middle portion along a transverse direction, a rearward extending rib 346 behind the opening 347, a pair of retaining ribs 343 located at sides of the extending rib 346 respectively and bending downwards and a pair of spring tab 344 with outward arc portions 3441 extending from two rear side edges thereof. The middle tongue 313 is assembled to the lower terminal module 312 in an upper-to-lower direction as best shown in FIG. 7, wherein the retaining rib 343 are inserted into and retained in corresponding holes 3325 (labeled in FIG. 6(A)) and the opening 345 is guided and retained with a post 3326, the extending rib 346 is received in a shallow recess defined on a top of the lower terminal module 312, and the spring tabs 344 are located at side recess 3327 defined on side of the insulators of the lower terminal module.

Figure 8:
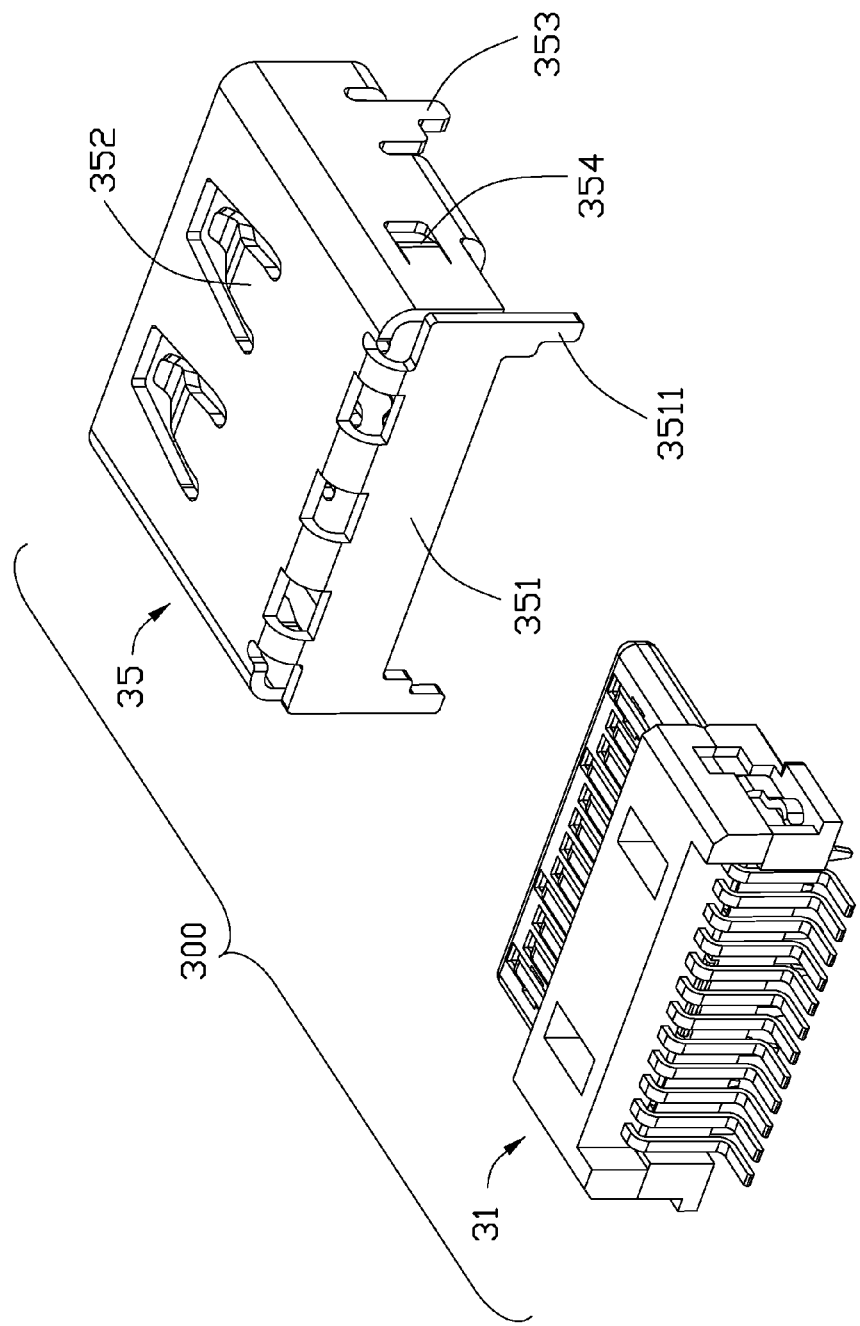
FIG. 8 is a perspective view of the receptacle connector with the further partially assembled housing of the receptacle connector of FIG. 4.
Figure 11:
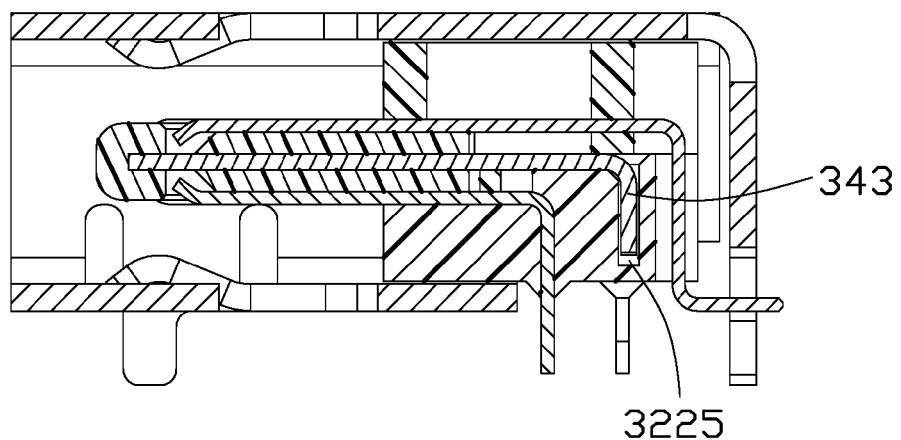
FIG. 11 is a cross-section view of the receptacle connector mounted on the printed circuit board, essentially showing an arrangement of the contacts and the shielding plate.

The upper terminal module 311 is assembled to the middle tongue 313 and the lower terminal module 312 as best shown in FIG. 8, wherein the post 3326 protruding beyond the shielding/grounding plate 34 and inserted into an opening 3315 as best shown in FIG. 11 through a lower face of the insulator of the upper terminal module 311. Therefore, the terminal module assembly 31 is configurated.

Figure 9:
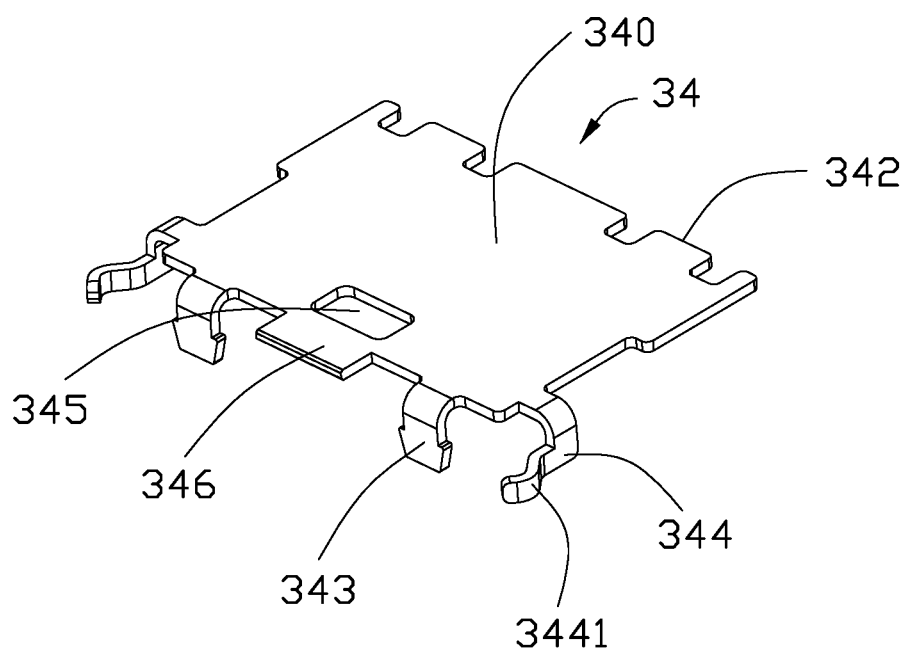
FIG. 9 is a perspective view of a shielding plate of the receptacle connector of FIG. 4.
Figure 10:
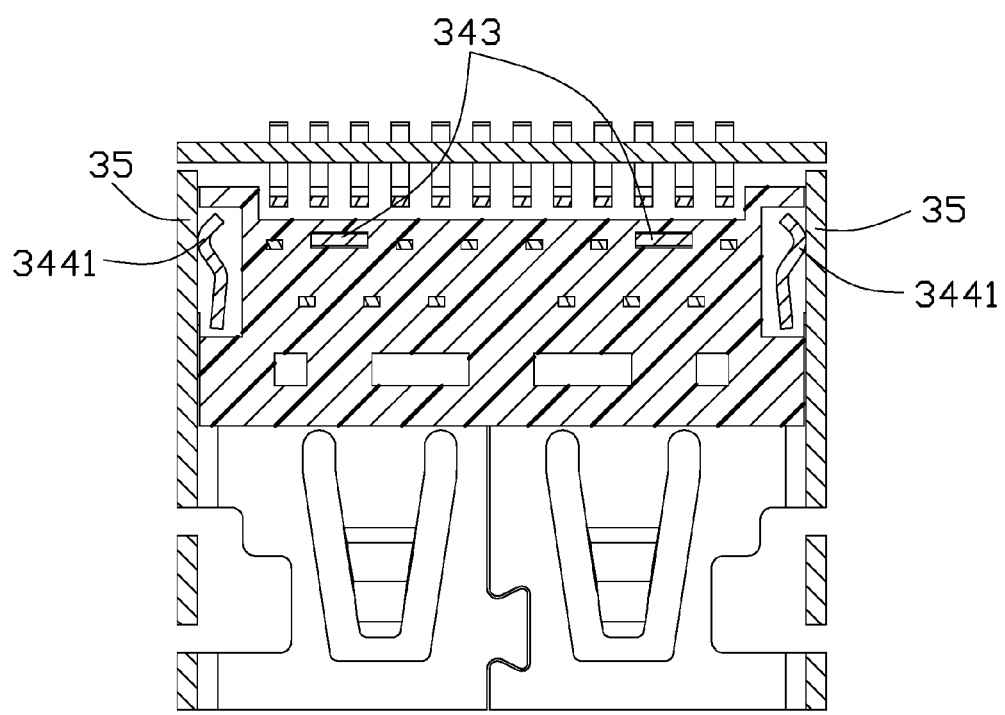
FIG. 10 is a cross-section view of the receptacle connector mounted on a printed circuit board, essentially showing an engagement of the spring tabs and the metallic shell.

A metallic shell 35 encloses the terminal module assembly 31 so as to form a mating cavity 301 in which the middle tongue 313 forwardly extends. The spring side tabs 344 electrically and mechanically contact the shell 35 as best shown in FIG. 10. Referring to FIG. 9, the shielding/grounding plate 34 includes front protruding edges 342 exposed outside of a corresponding edge of the middle insulator 333 for ESD (Electro Static Discharge) and anti-wearing during incorrect angular mating. The important issue of the mating plug connector 200 and receptacle connector 300 is that the plug connector 200 is flippable with regard to the receptacle connector 300 during mating with two different orientations. Understandably, to achieve this flippable function, the mechanical structure of the mating port of the receptacle connector 300 and that of the plug connector 200 optimally are of a symmetrical manner with regard to an imaginary horizontal center line. Correspondingly, the assignment of the contacts should be also in a symmetrical manner with regard to a center point in a diagonal manner, i.e., being reversed in both the vertical direction and the horizontal direction.

Figure 12:
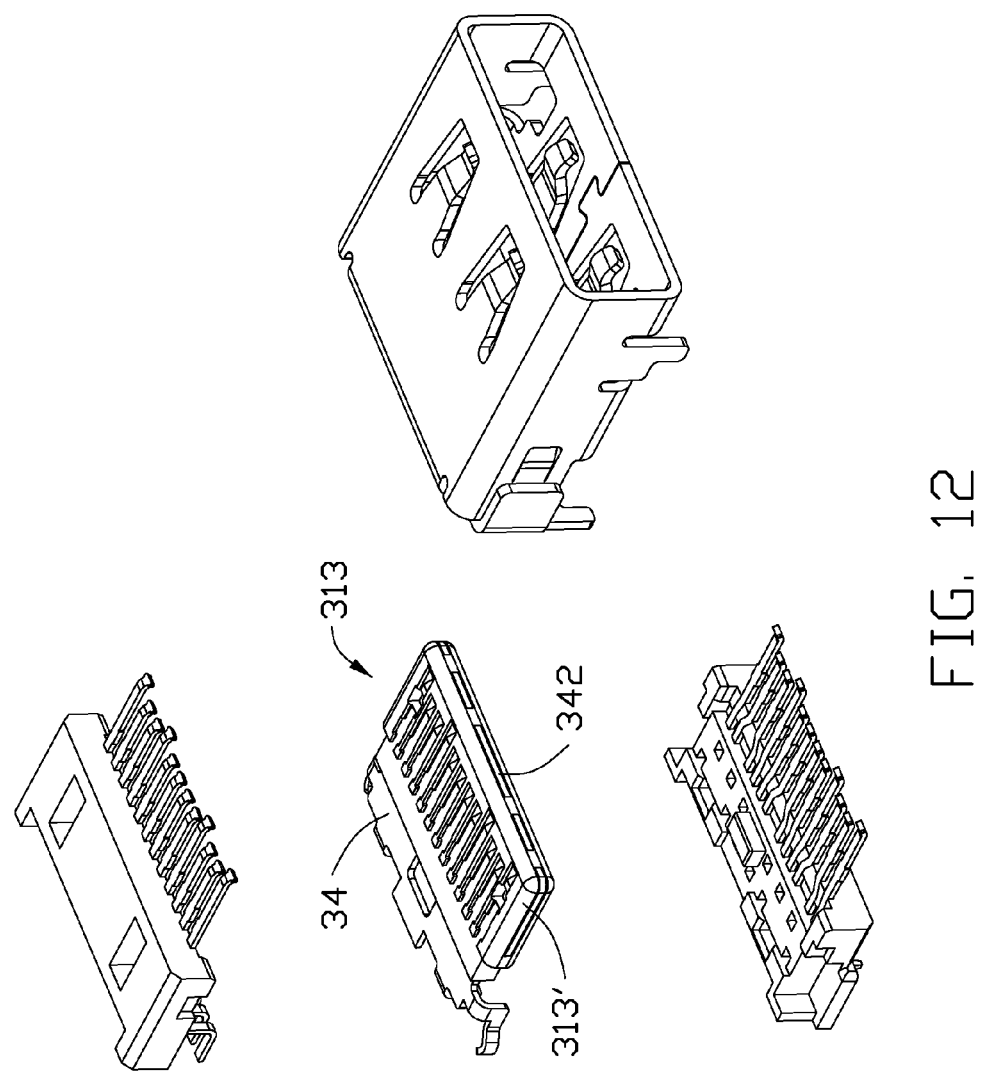
FIG. 12 is similar to FIG. 6(A) and FIG. 6(B)
Figure 13:
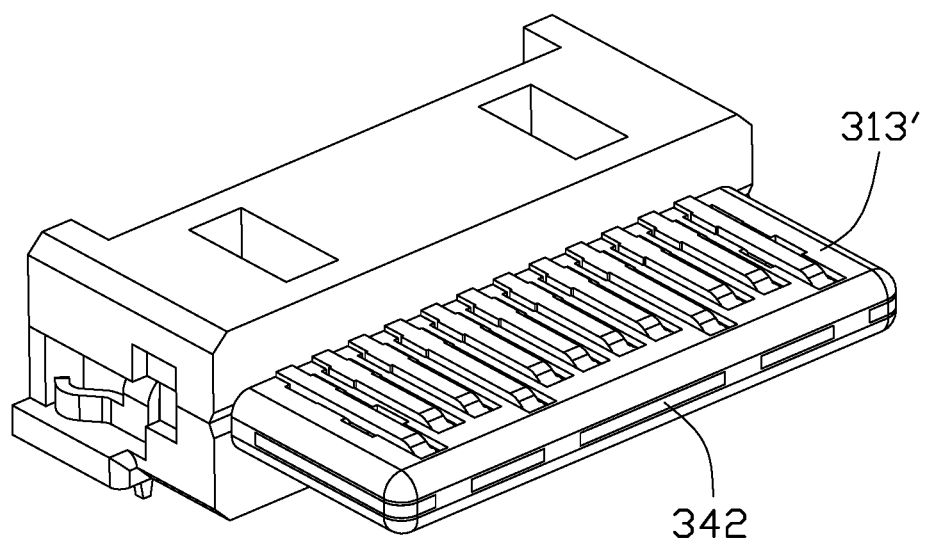
FIG. 13 is a perspective view of a terminal module assembly of the receptacle connector of FIG. 12.
Figure 14:
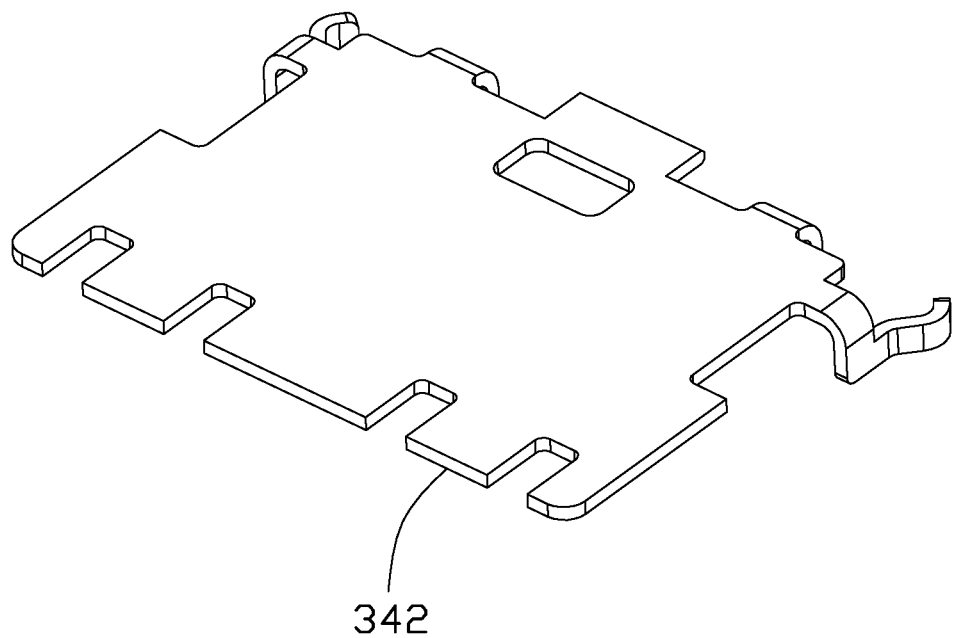
FIG. 14 is a perspective view of the shielding plate in FIG. 12.
Figure 15:
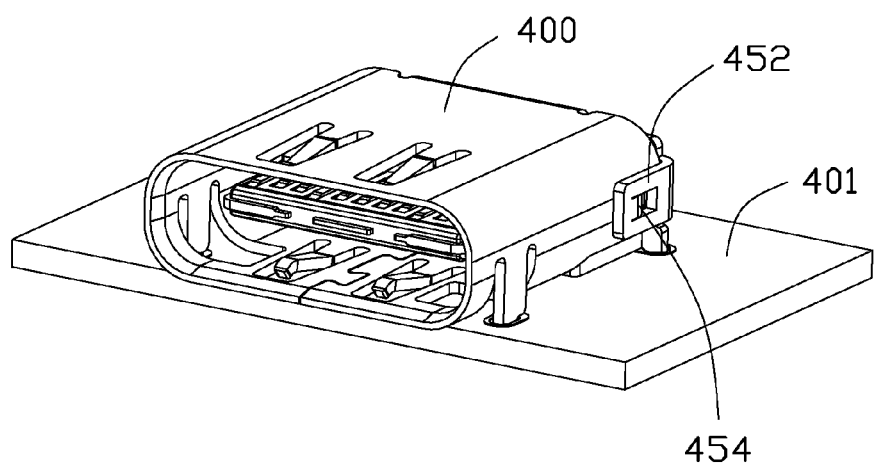
FIG. 15 is a perspective view of a receptacle connector of a second embodiment of this invention; which is mounted on a printed circuit board.

FIGS. 12-14 is are essentially similar to FIGS. 4-11 to show the two features of the invention of which, the first one is the center insert molded shielding/grounding plate 34 encompasses the boundary of the mating tongue 313' of the middle tongue 313 and the front edges 342, exposed to corresponding front edges of the mating tongue 313', to prevent damage of the mating tongue when the corresponding plug connector 200 or even an incorrect other type plug connector is improperly incorrectly mated/inserted in a sidewardly angular manner, and the second one is the mating tongue 313' is essentially sandwiched between the upper insulator and the lower insulator in a flexible manner to prevent damage of the mating tongue when the plug connector 200 is incorrectly mated/inserted in an upward or downward tilted manner.

FIG. 15 through 21 shows the receptacle connector or first electrical connector 400 of a second embodiment for mounting to the printed circuit board 401, including a metallic shell 45 and a terminal assembly 41 essentially composed of the upper terminal module 411 with the upper contacts 421 inserted molded thereon and the lower terminal module 412 with the lower contacts 422 insert molded thereon to commonly sandwich the middle shielding plate module 413 in the vertical direction in the assembling way wherein the mating tongue 413' is provided by the middle shielding plate module 413 only and the shielding plate 44 is insert molded with the middle shielding plate module 413. The shell 45 restrains the terminal assembly 41 in the front-to-back direction by the rear lower edge of the capsular configuration of the shell 45 rearwardly abutting against the lower terminal module 412 and the rear cover 451 forwardly abutting against both the upper terminal module 411 and the lower terminal module 412. The rear cover forms a pair of locking ears 452 with lances 454 latched to the side region of the shell 45.

Figure 5:
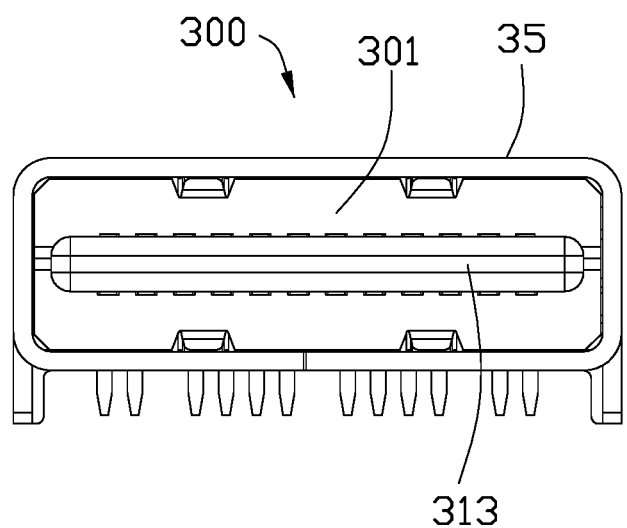
FIG. 5. is a front elevational view of the receptacle connector of FIG. 4.
Figure 6A:
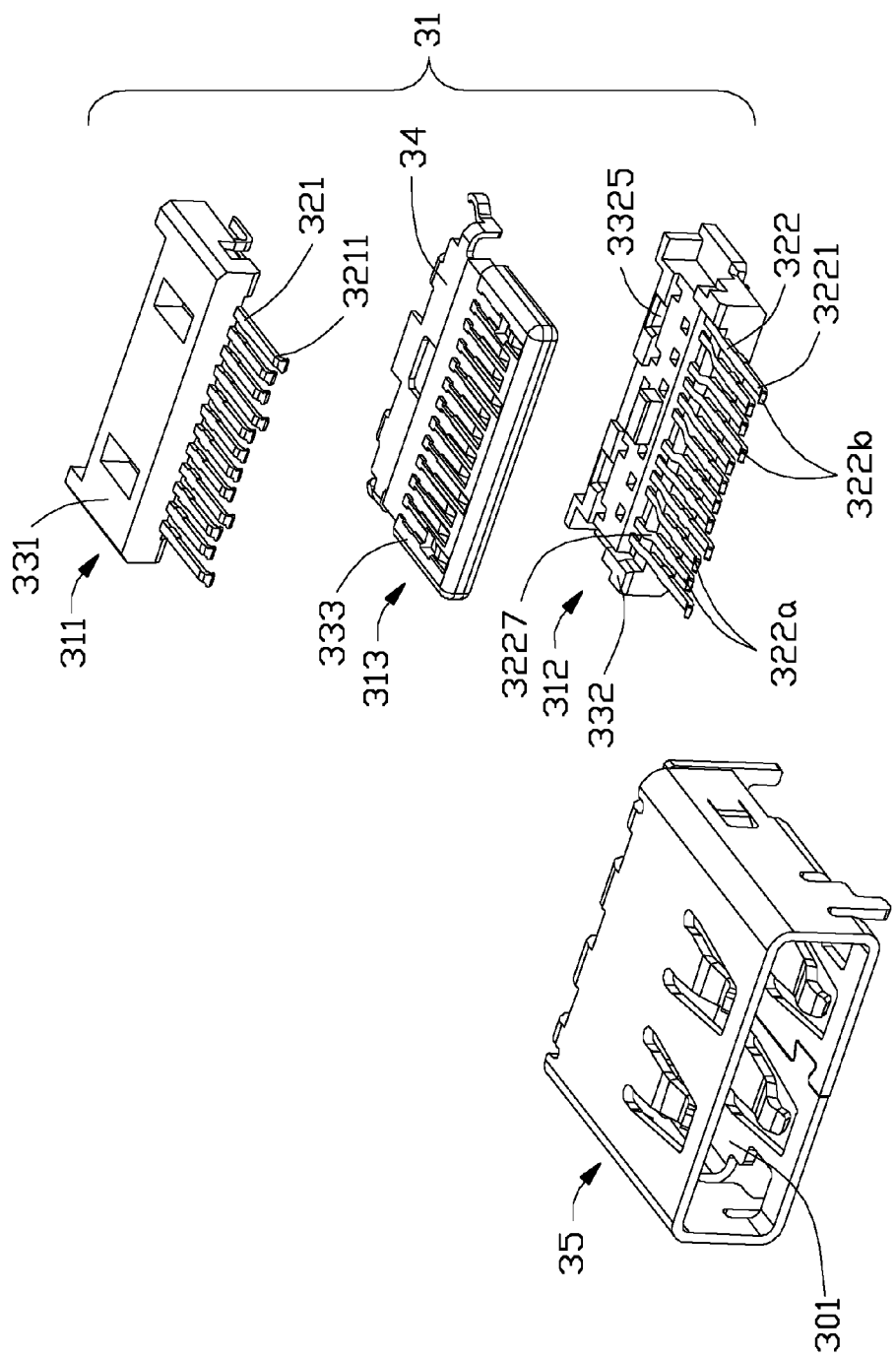
FIG. 6(A) is an exploded perspective view of the receptacle connector of FIG. 4.
Figure 6B:
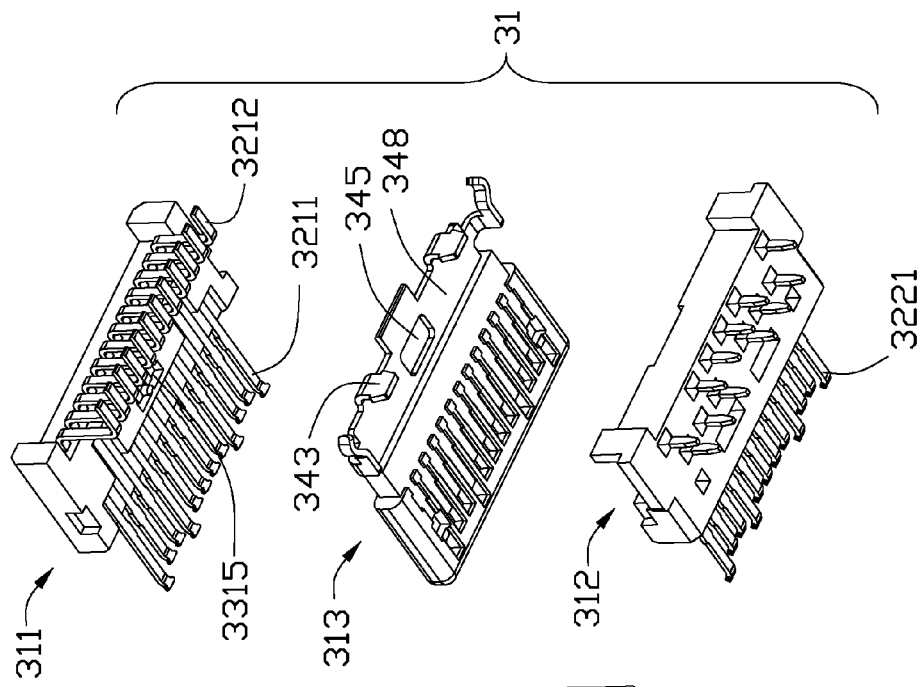
FIG. 6(B) is another exploded perspective view of the receptacle connector of FIG. 4.
Figure 6B:
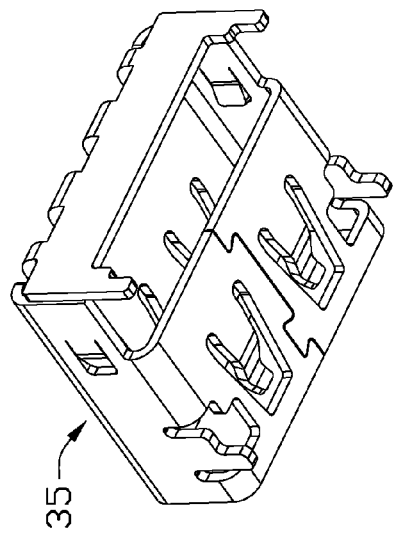
Figure 16:
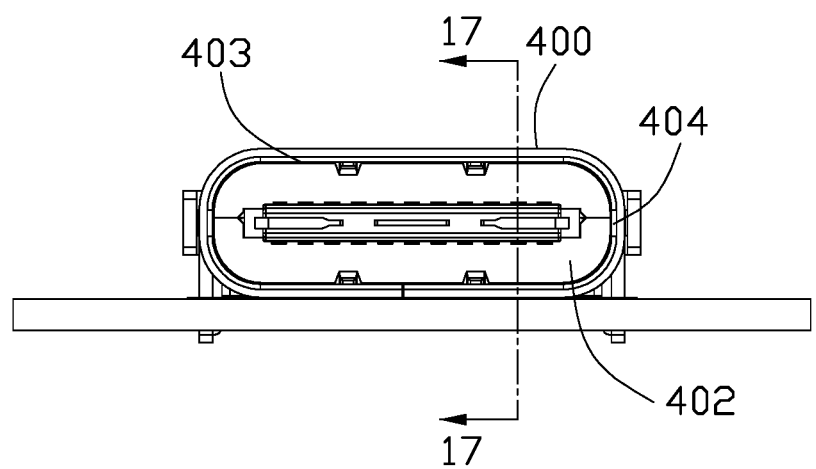
FIG. 16 is a front elevational view of the receptacle connector and the PCB of FIG. 15.

The receptacle connector 400 has an outlet of mating cavity 402 as best shown in FIG. 16 which is formed with the metallic shell 45. The outlet of the mating cavity 402 has two parallel longer-line sides 403 and two half-circle sides 404 connecting with the longer-line side 403, while the outlet of the receptacle connector 300 of the first embodiment is of rectangular shape as best shown in FIG. 5. The common ground is that the two receptacle connector is inserted with the corresponding plug connector in either of two insertion orientations.

Figure 17:
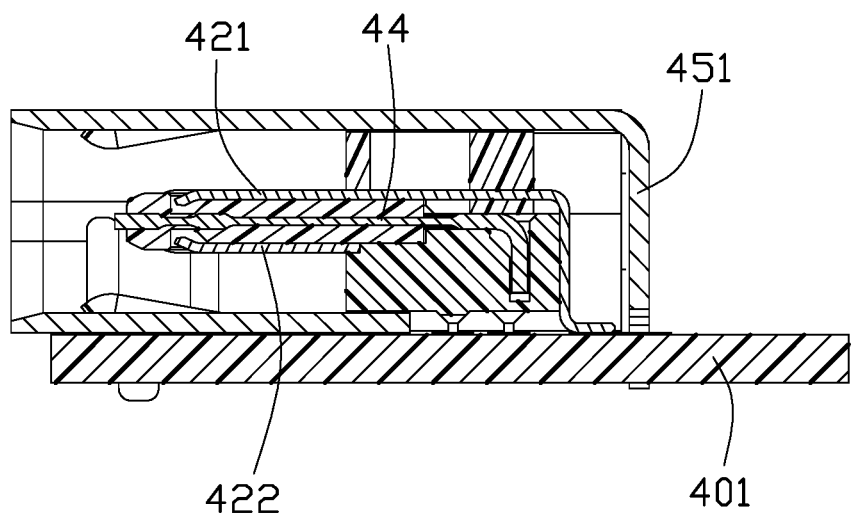
FIG. 17 is a cross section view of the receptacle connector and the PCB taken along lines 17-17 in FIG. 16.
Figure 18:
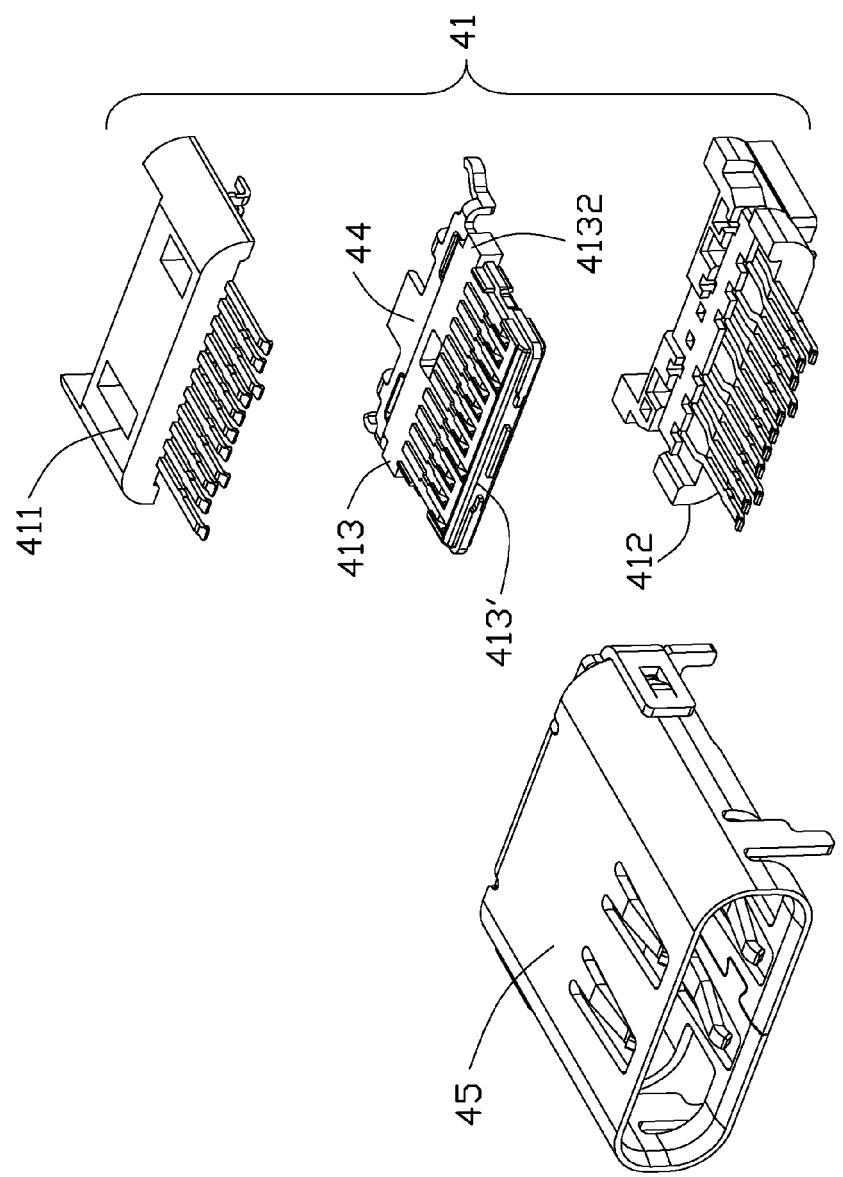
FIG. 18 is an exploded perspective view of the receptacle connector in FIG. 16, FIG. 18 (A) is another embodiment of the shell for use with the receptacle connector of FIG. 16.
Figure 18A:
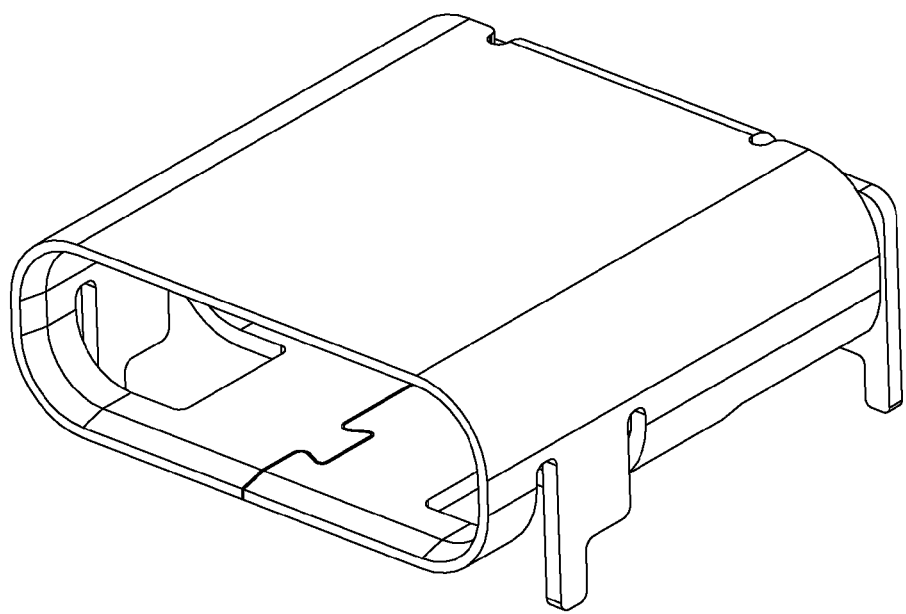
FIG. 18(B) is the assembled terminal module assembly of the receptacle connector.
Figure 18B:
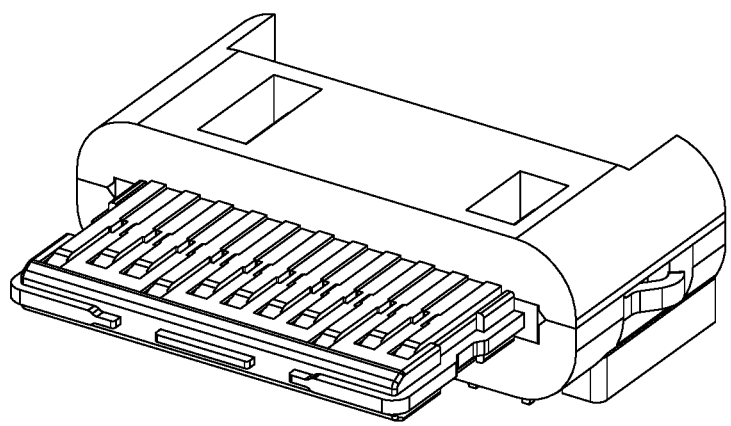
Figure 19:
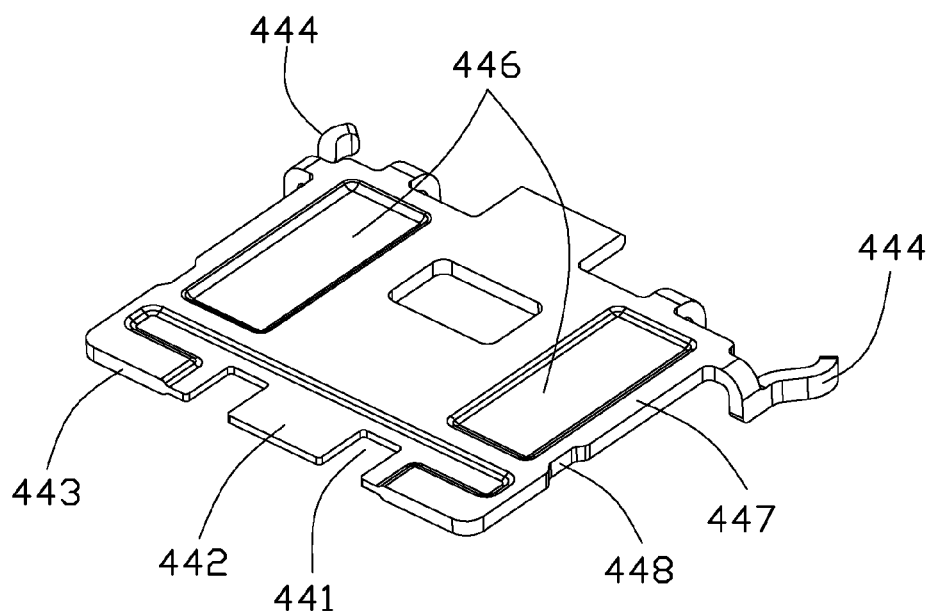
FIG. 19 is a perspective view of the shielding plate in FIG. 16.
Figure 20:
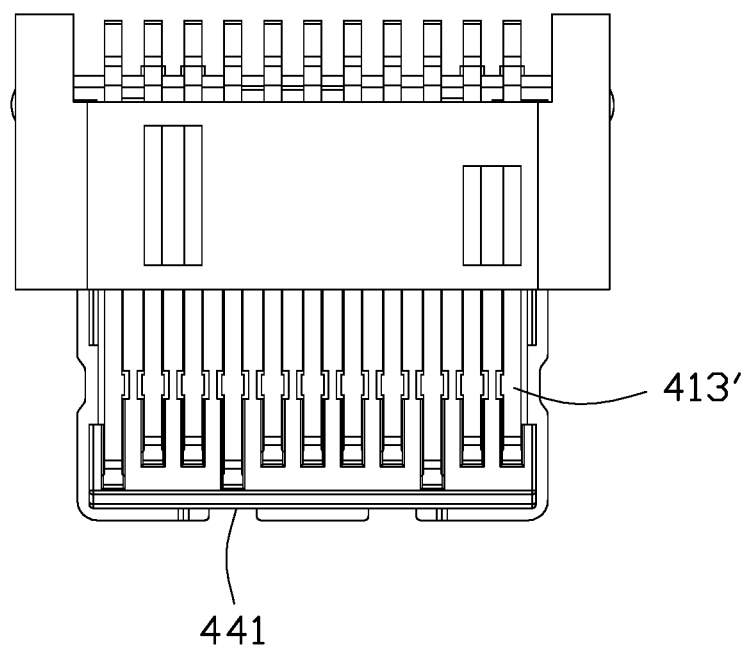
FIG. 20 is a top elevational view of the terminal module assembly.
Figure 21:
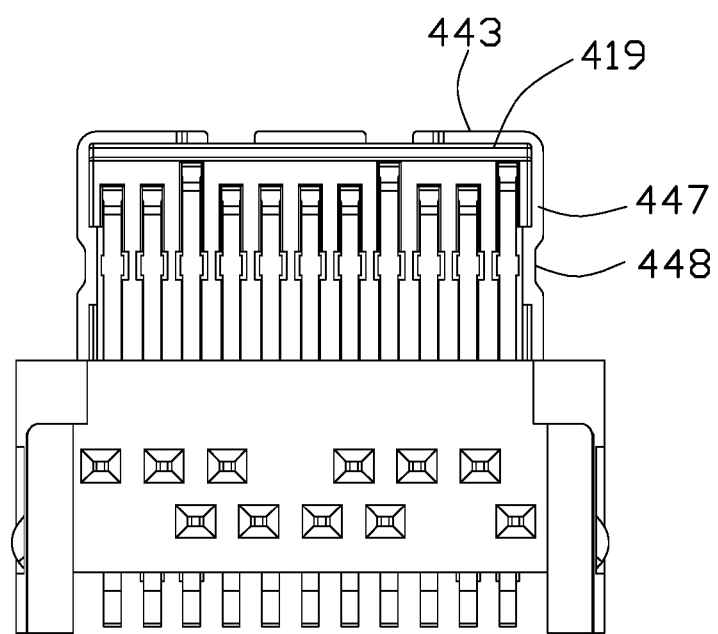
FIG. 21 is a bottom elevational view of the terminal module assembly.

The metallic shielding plate 44 for not only shielding but also reinforcing, defines two cutouts 441 in a front edge region and running through THE front edge thereof, and a thinned or even empty front region 442 wherein the front edge 443 extends slightly beyond the front edge 419 of the mating tongue 413' so as to efficiently prevent damage to the mating tongue 413' due to improper insertion of the (incorrect) plug connector. The cutout 441 is aligned with the corresponding power contact of the plug connector so as to prevent the power contact of the plug connector to contact the shielding plate 44, referring to FIG. 20. On the other hand, other contacts of the plug connector can contact the front edge 443 of the shielding plate 44 during initial mating. It is noted as best shown in FIG. 17 that thinned front edge region 442 may allow the front ends of the corresponding contacts to be inwardly deflected to form a lead-in configuration for better retention and easy insertion without a shorting risk induced by the external part. The shielding plate 44 further defines thinner regions 446 at a rear region thereof to improve SS impedance control. The spring tabs 444 are adapted to be electrically and mechanically connected to the shell 45. The lateral side edges 447 of the shielding plate 44 protrude the mating tongue 413' and a notch 448 is defined on each lateral side edges 447 to assure direct touch/lock with a metal latch 209 of a plug connector 500 shown in FIGS. 24-26.

Figure 24:
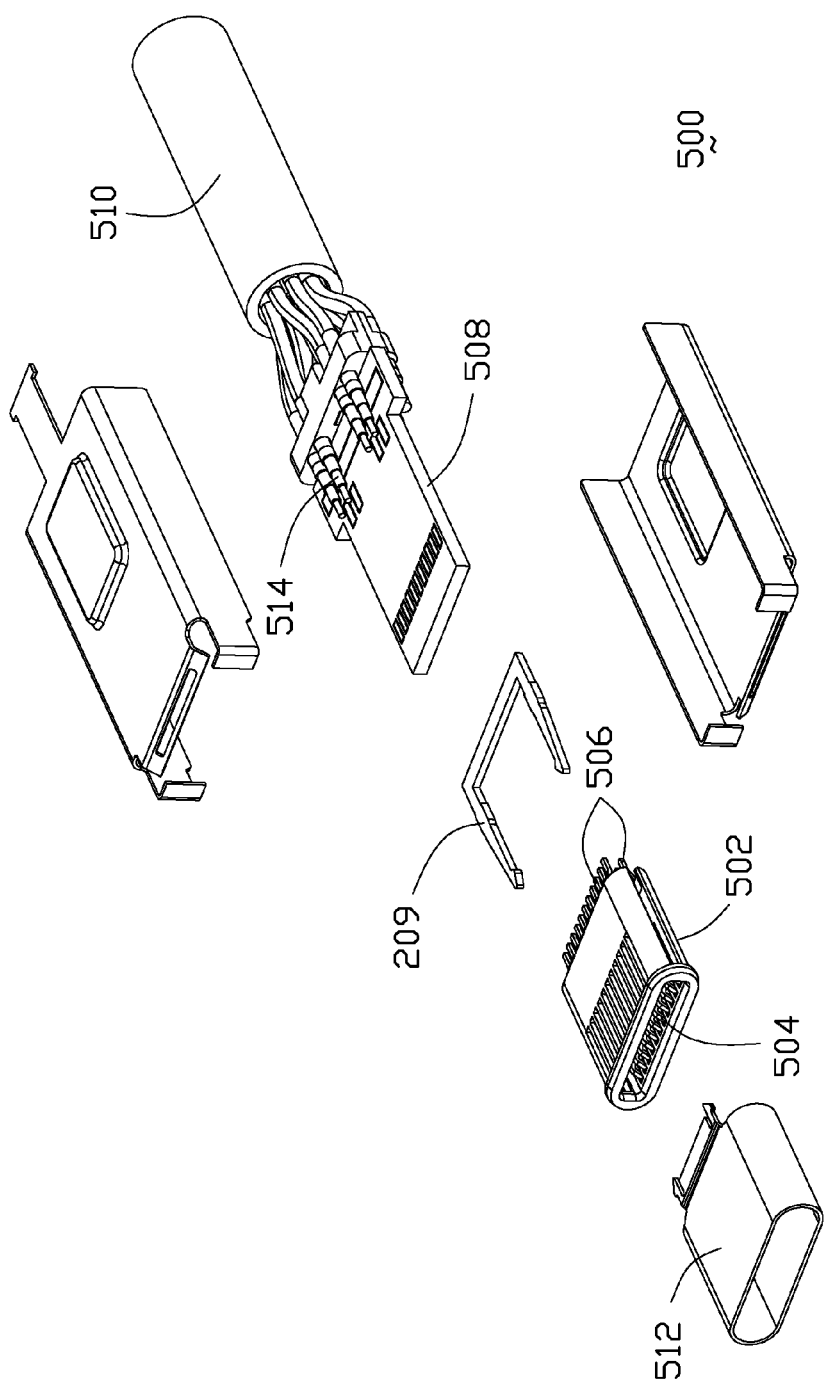
FIG. 24 is an exploded perspective view of the plug connector (not showing the outer jacket) for use with the receptacle connector of FIG. 15 or FIG. 23.
Figure 25:
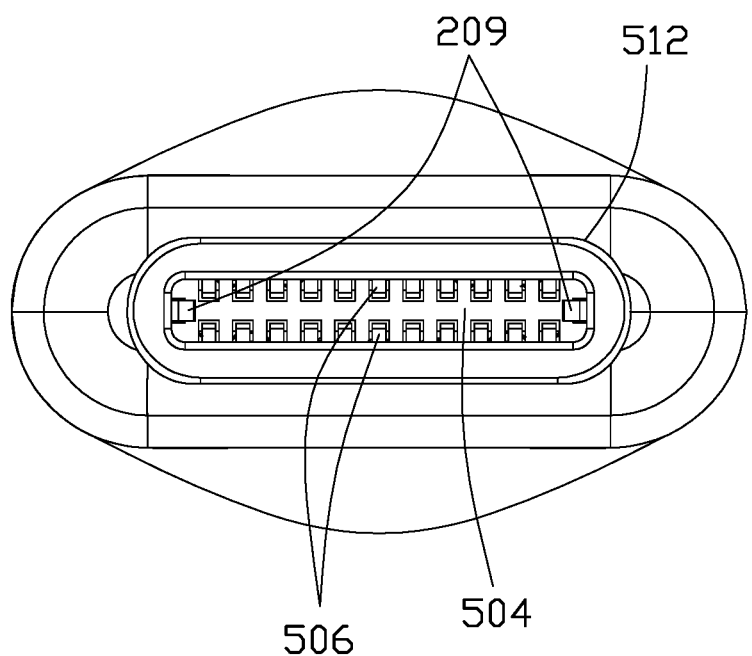
FIG. 25 is a front elevational view of the plug connector of FIG. 24.
Figure 26:
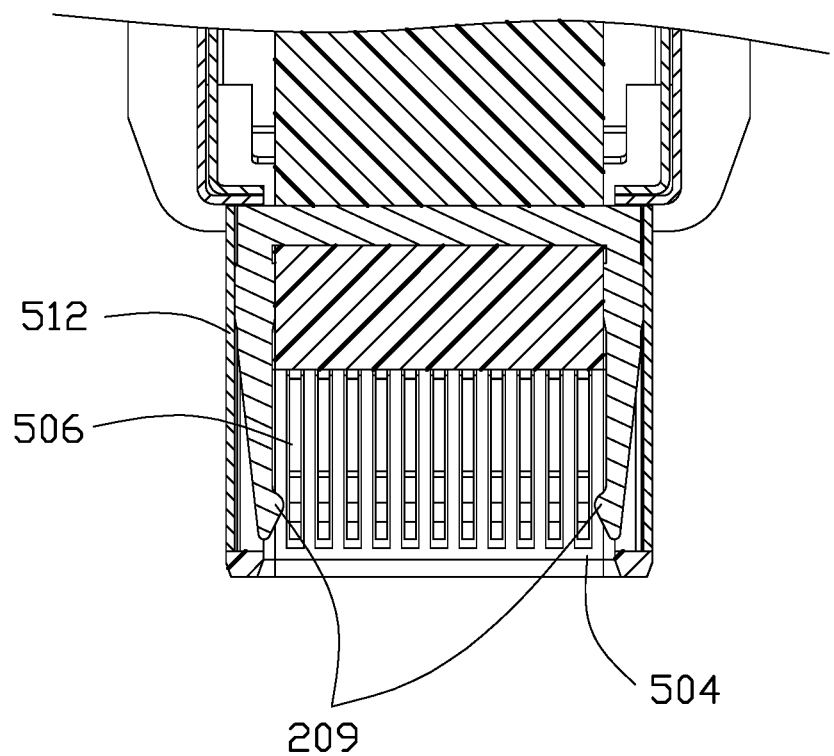
FIG. 26 is a cross-sectional view of the plug connector of FIG. 24.
Figure 27:
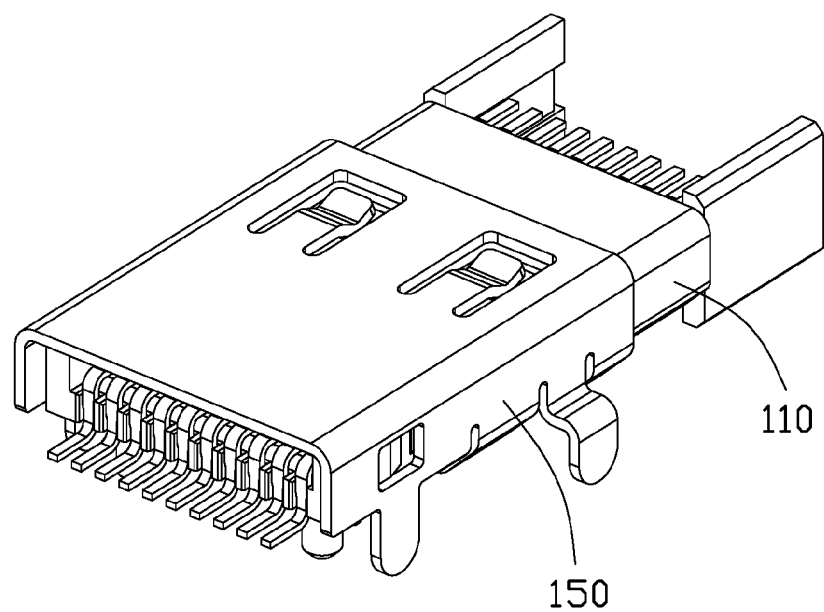
FIG. 27 is an assembled perspective view of the mated receptacle connector and plug connected according to a fifth embodiment of the present invention.
Figure 28:
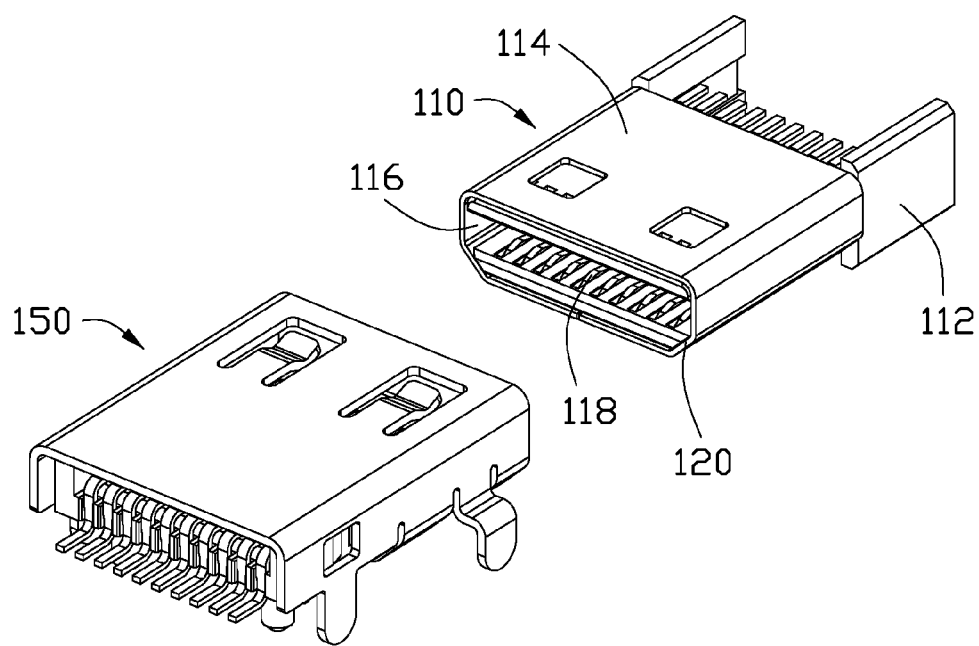
FIG. 28 is an assembled perspective view of the plug connector and the receptacle connector of FIG. 27 in an un-mated condition.
Figure 29:
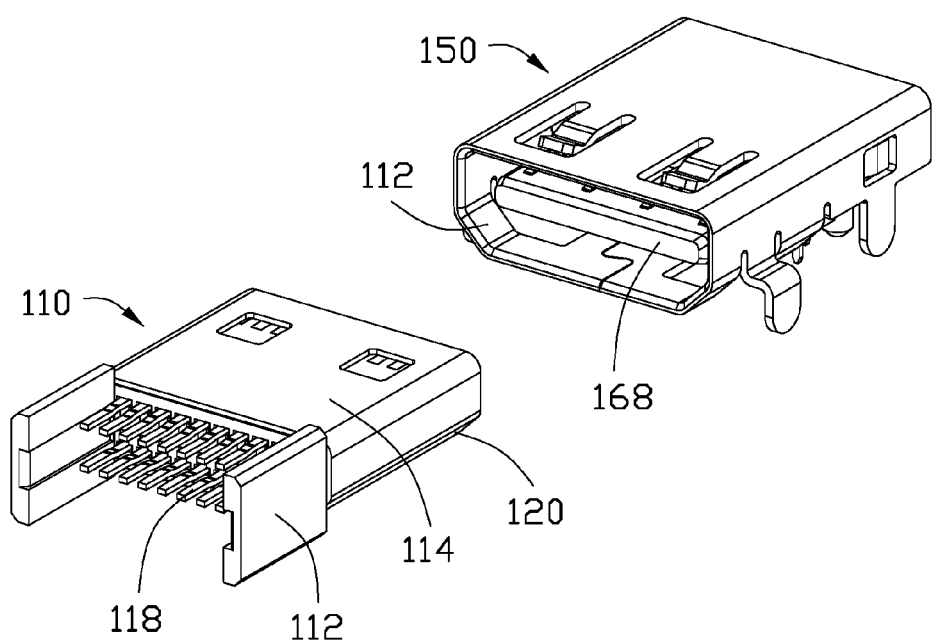
FIG. 29 is another assembled perspective view of the plug connector and the receptacle connector of FIG. 27 in an un-mated condition.
Figure 30:
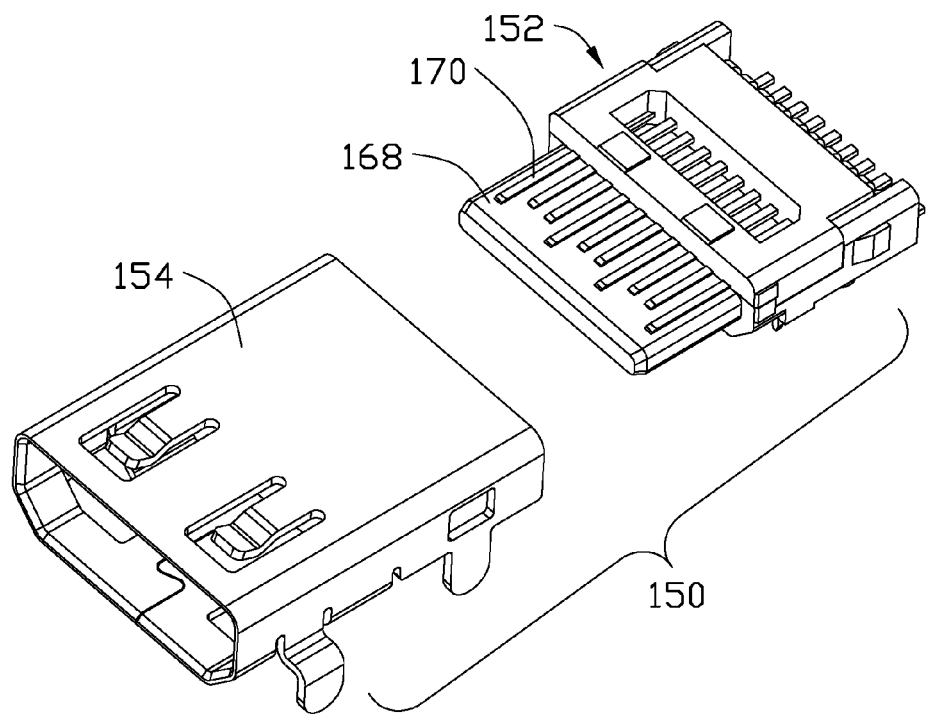
Figure 31:
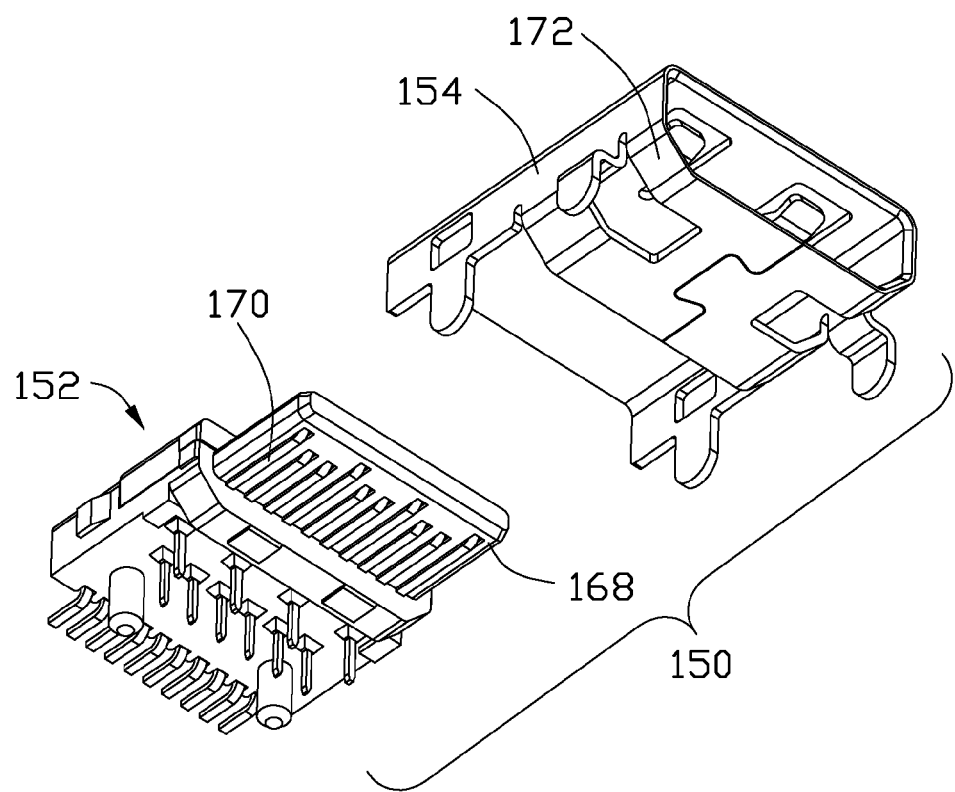
FIG. 31 is another exploded perspective view of the receptacle connector of FIG. 27.
Figure 32:
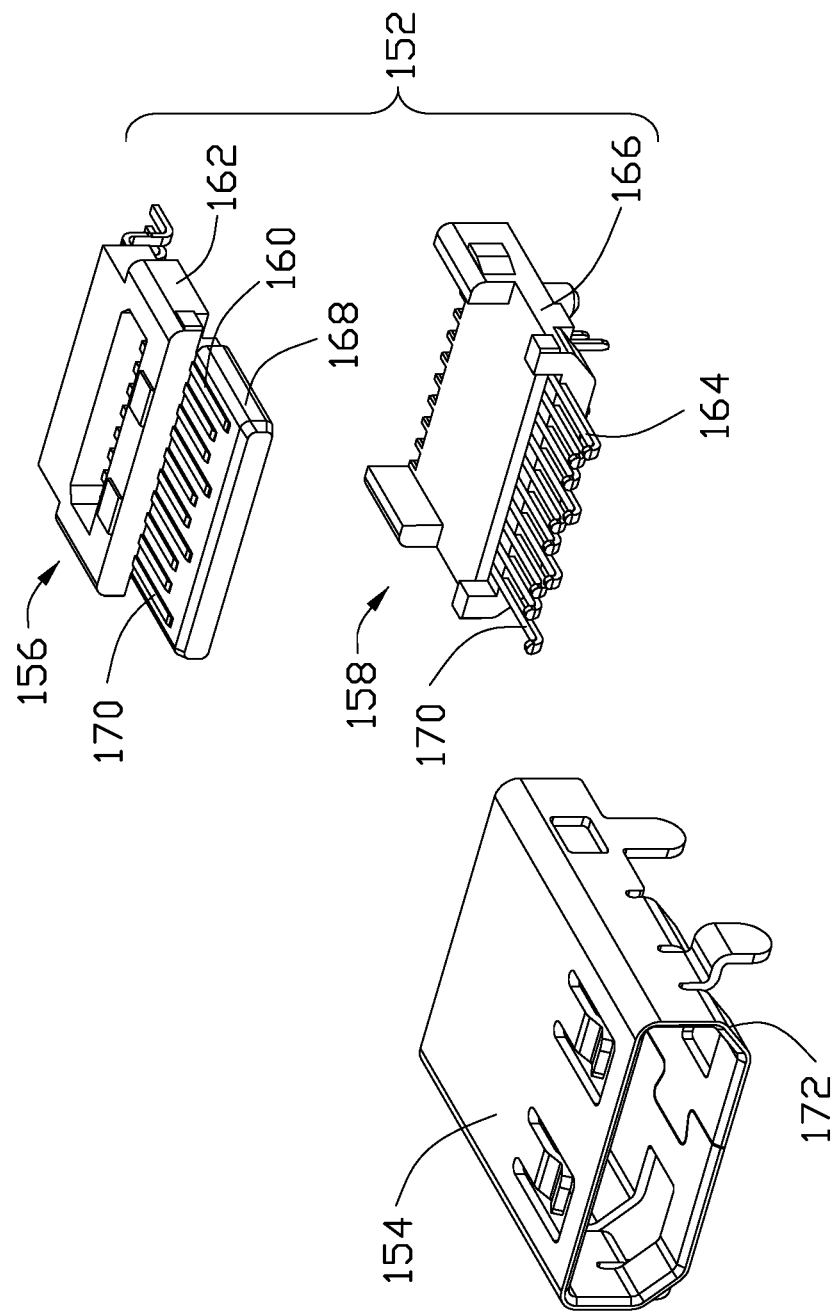
FIG. 32 is an exploded perspective view of the receptacle connector of FIG. 27 to show the discrete terminal modules.
Figure 33:
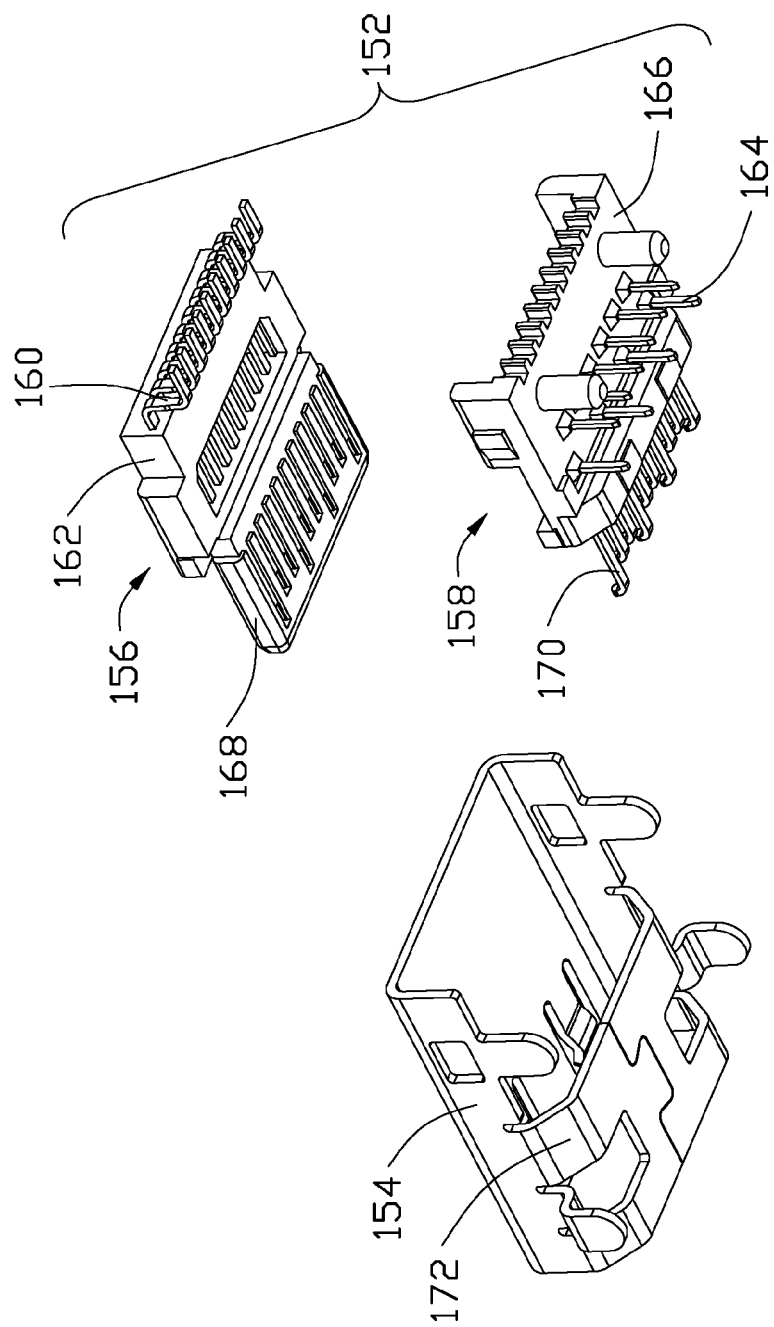
FIG. 33 is another exploded perspective view of the receptacle connector of FIG. 27 to show the discrete terminal modules.
Figure 34:
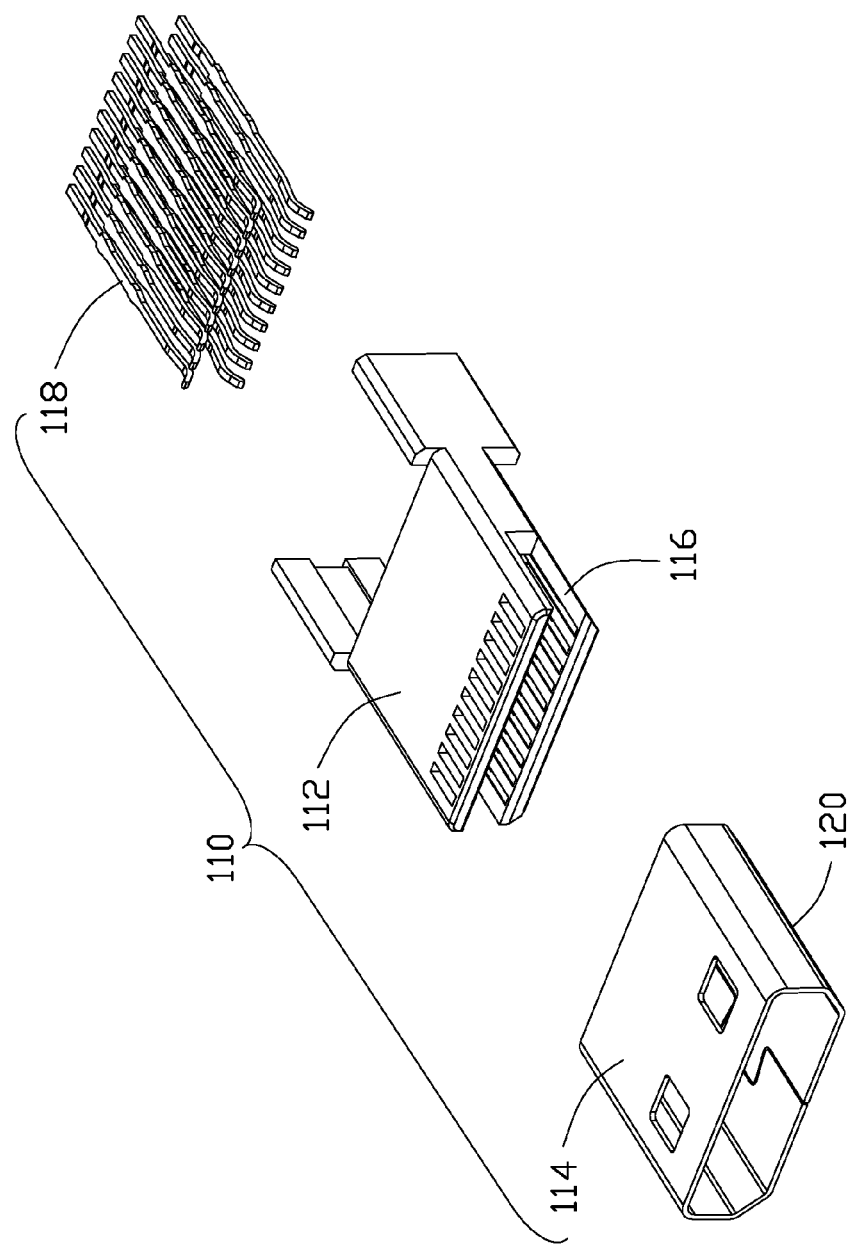
FIG. 34 is an exploded perspective view of the plug connector of FIG. 27.
Figure 35:
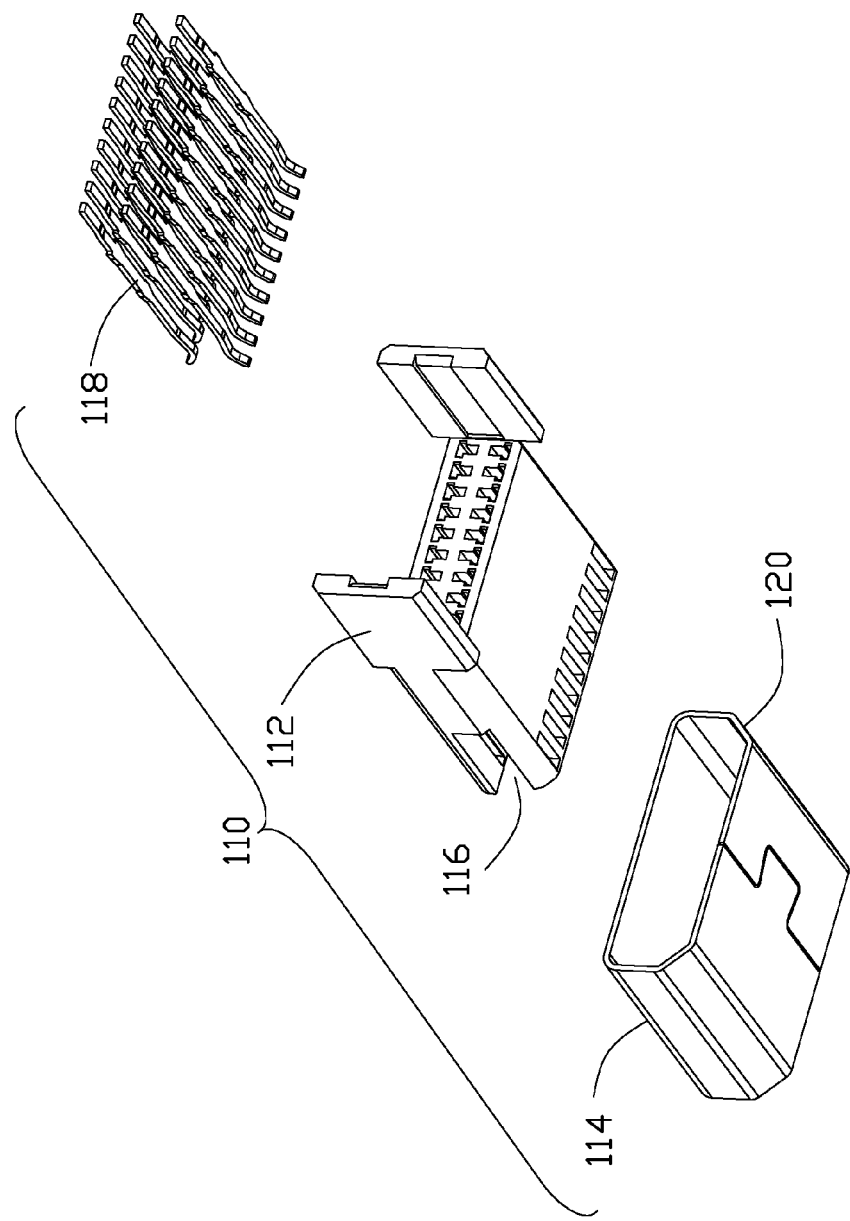
FIG. 35 is another exploded perspective view of the plug connector of FIG. 33.
Figure 36:
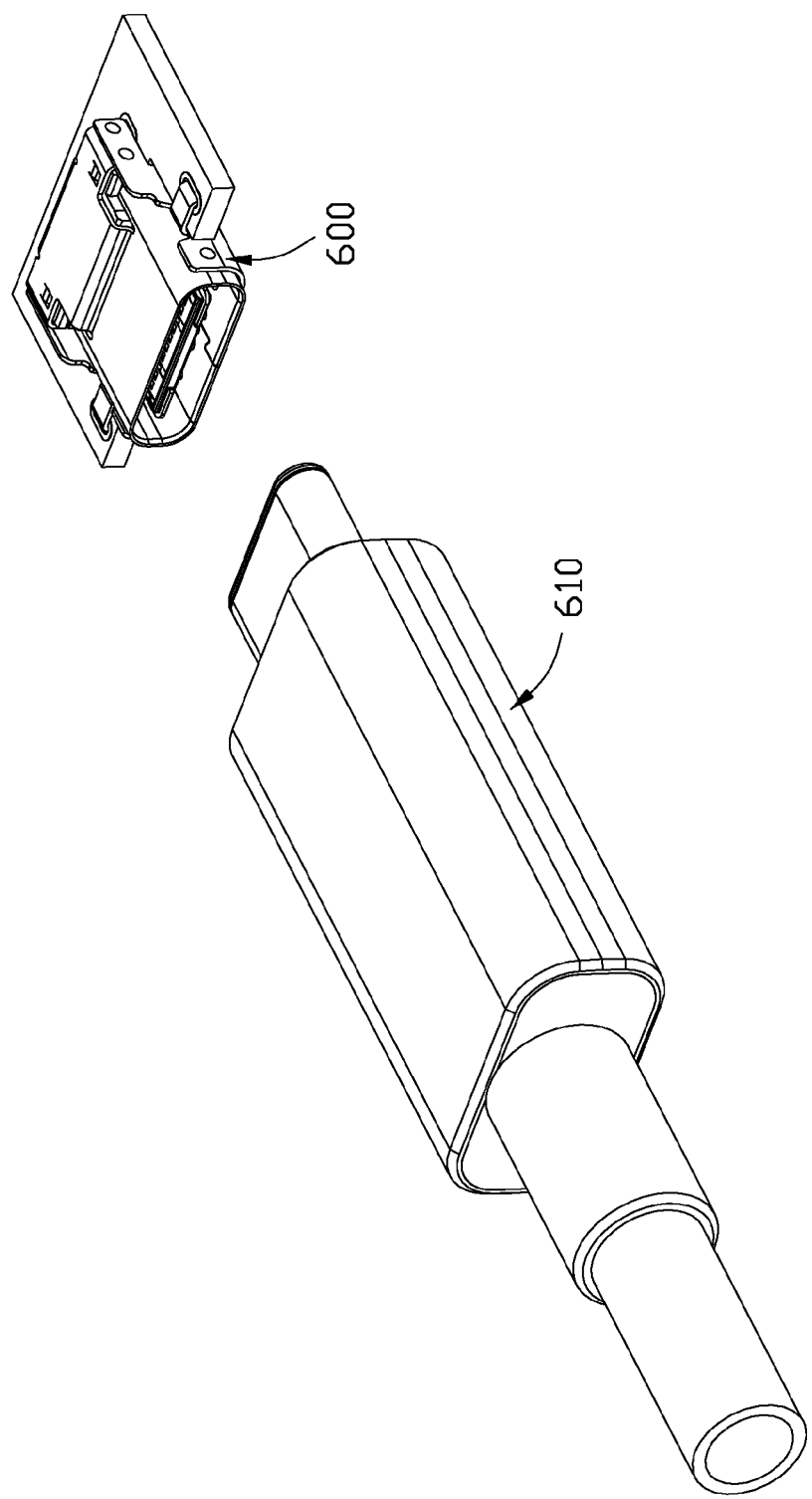
FIG. 36 is an exploded perspective view of the receptacle connector and the plug connector according to another embodiment of the present invention'
Figure 37:
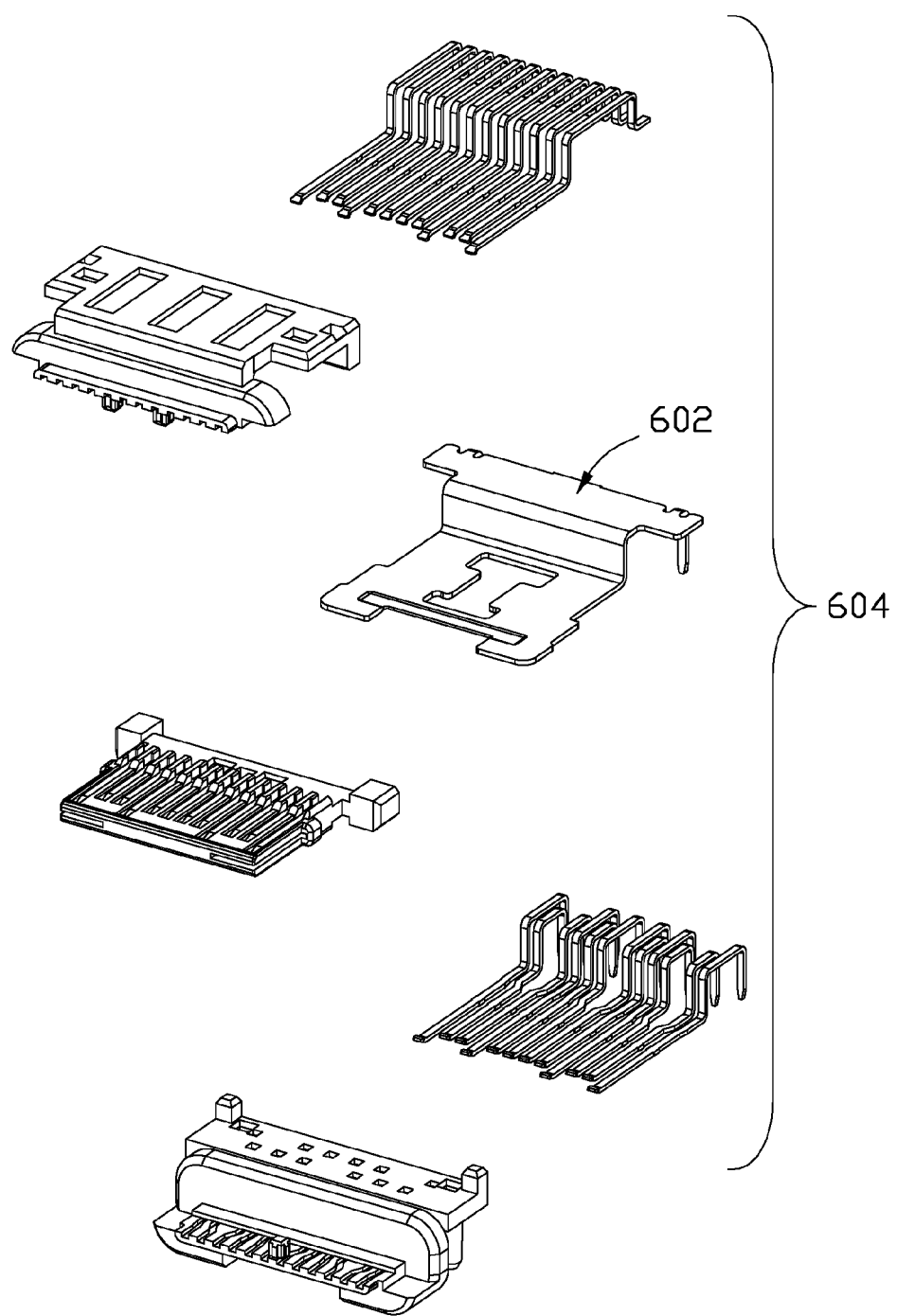
FIG. 37 is an exploded perspective view of the terminal module assembly of the receptacle connector of FIG. 36.
Figure 38:
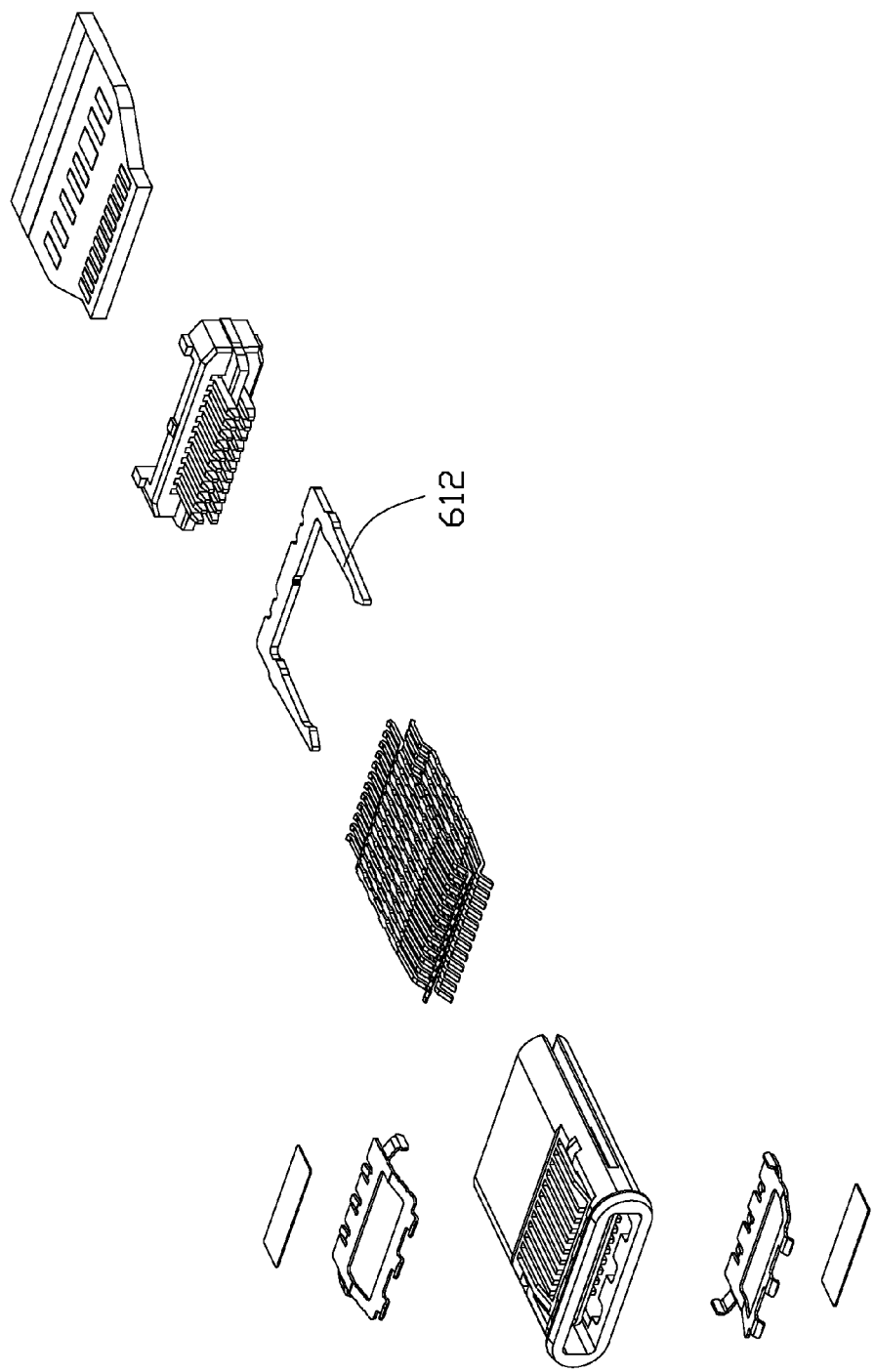
FIG. 38 is a exploded perspective view of the plug connector of FIG. 36.
Figure 39:
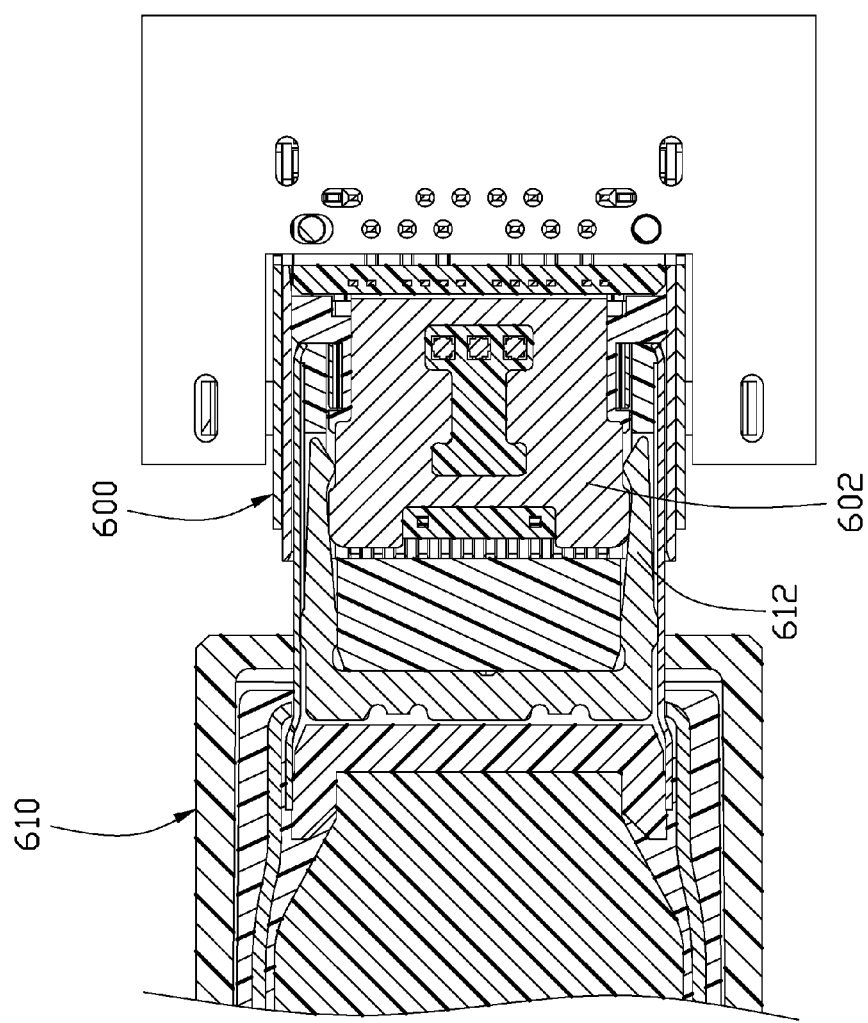
FIG. 39 is a cross-sectional view of the assembled plug connector and receptacle connector to show the engagement between the shielding plate of the receptacle connector and the latch of the plug connector.

Referring to FIGS. 24-26, the plug connector 500 includes an insulative housing 502 defining a receiving cavity 504 with two rows of contacts 506 extending thereinto. The tails of the contacts 506 are mechanically and electrically connected to a paddle card 508 behind the housing 502, and a cable 510 having a plurality of wires 514 mechanically and electrically connected to the paddle card 508. The latch 209 defining a pair of lateral deflectable arms, is positioned in front of the paddle card 508 and extends into the receiving cavity 504 to mechanically and electrically connect to the shielding plate 44. A metallic shell 512 encloses the housing 502, and a pair of metallic covers enclosing the housing 502 and the paddle card 508 and is fastened to the cable 510.

Figure 22A:
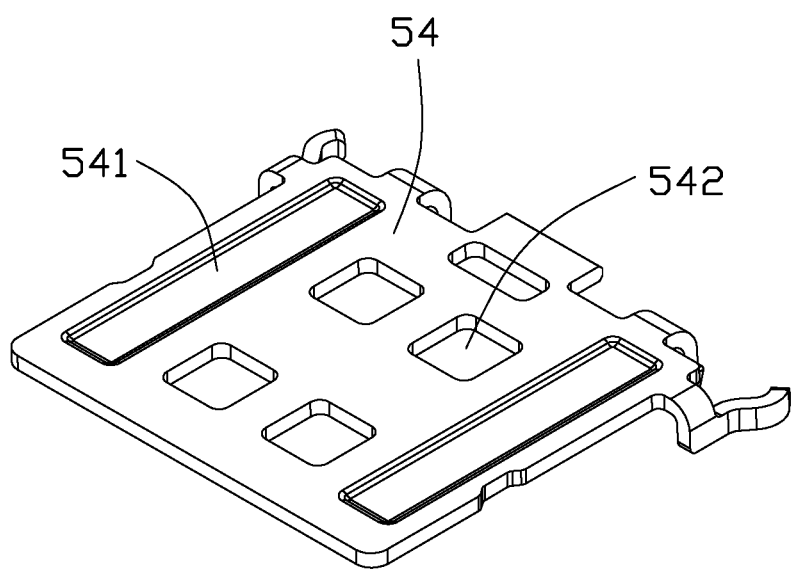
FIG. 22(A) is a perspective view of another embodiment of the shielding plate for use with the receptacle connector.
Figure 22B:
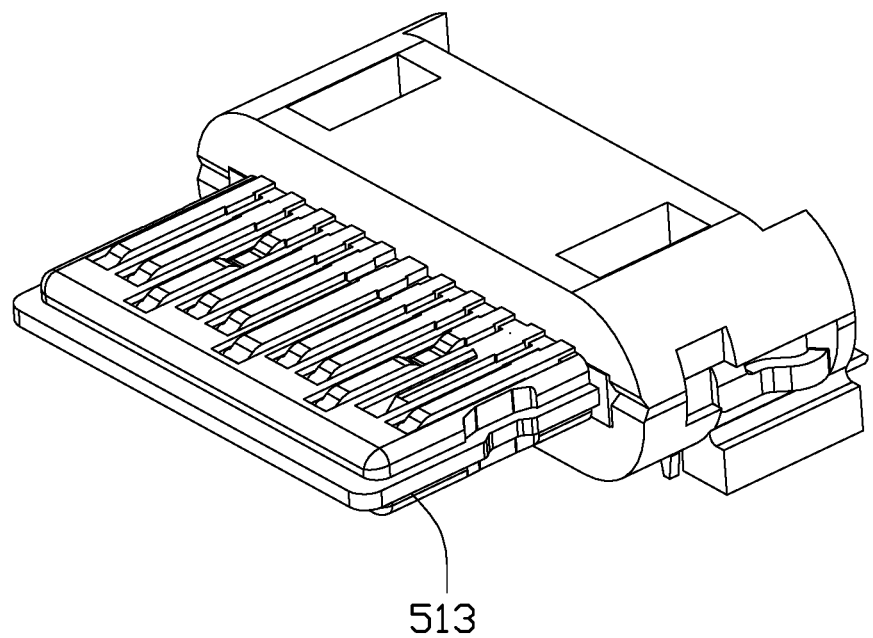
FIG. 22(B) is a perspective view of the assembled terminal module assembly for use with the shielding plate of 22(A)
Figure 23:
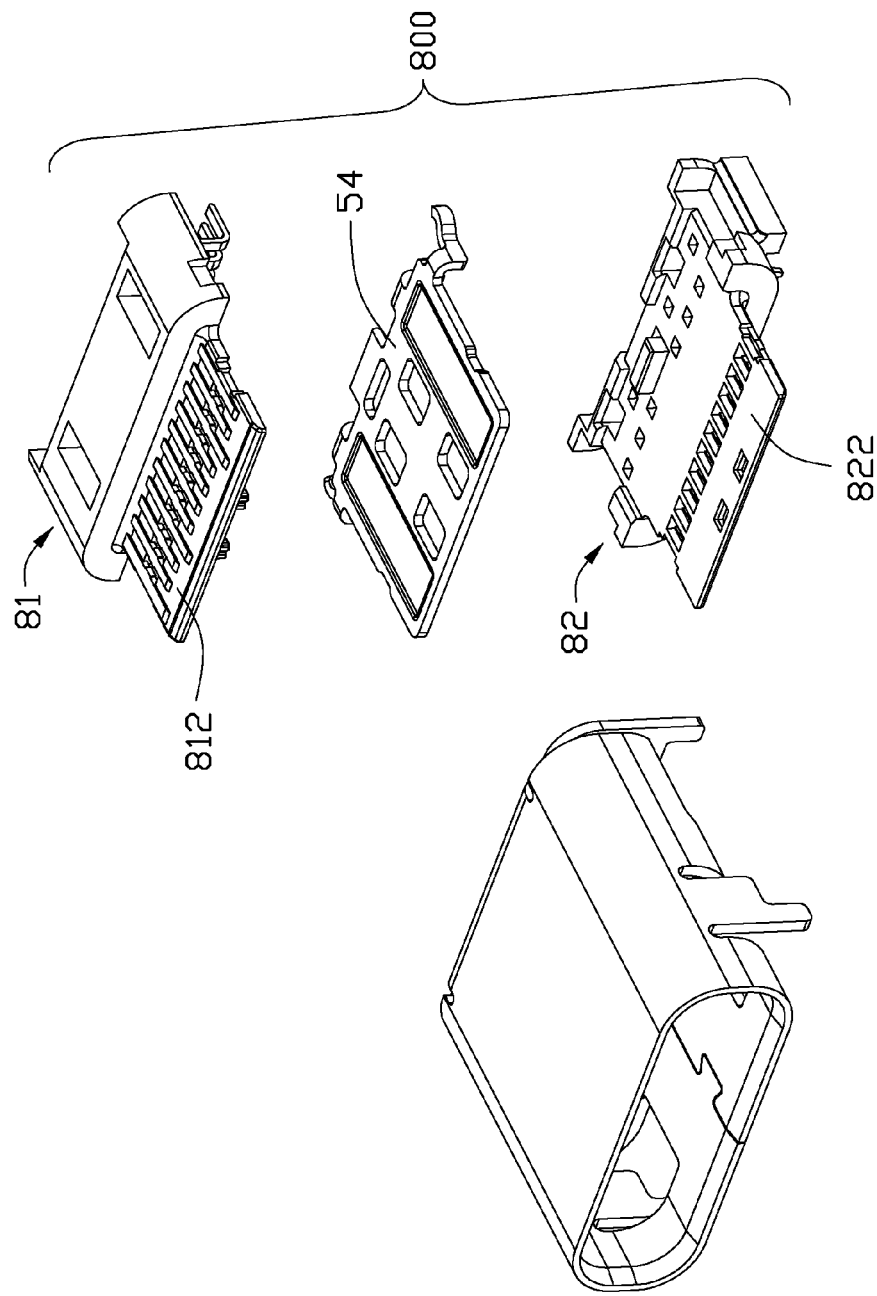
FIG. 23 is an exploded perspective view of the terminal module assembly of FIG. 22(B) and the metallic shield adapted to enclose thereon.

FIG. 22(A)-23 show a third embodiment similar to the receptacle connector 400 of the second embodiment, wherein the shielding plate 54 of the receptacle connector protrudes out of the front edge and the side edge of the mating tongue 513 for performing the anti-mismating and efficient grounding and locking functions. Two thinner regions 541 and four cutouts 542 between the two thinner regions 541 are defined in the shielding plate, which are just aligned with the signal contacts 52 to improve SS impedance control. One major difference between the receptacle connector 400 in FIGS. 16-21 and the receptacle connector 800 in FIGS. 22(A)-23 is that the former has the middle shielding plate module 413 itself to form the mating tongue while the latter has the upper mating tongue 812 of the upper terminal module 81 and the lower mating tongue 822 of the lower mating tongue 822 to commonly form the mating tongue 513.

In another embodiment, as shown in FIGS. 27-35, the plug connector 110 only partially shows the insulative housing 112 enclosed in the metallic shell 114 with a mating slot 116 and two rows of contacts 118 by two sides of the mating slot 116. Different from the plug connector 10 of the first embodiment, the plug connector 110 defines a pair of chamfered structures 120 at two lower corners. Correspondingly, the receptacle connector 150 includes a terminal module assembly 152 enclosed in a shell 154 wherein the terminal module assembly includes an upper terminal module 156 and a lower terminal module 158 stacked and assembled with each other. A plurality of upper contacts 160 are insert molded within an upper insulator 162 to form the upper terminal module 156, and a plurality of lower contacts 164 are insert molded within a lower insulator 166 to form the lower terminal module 158, wherein compared with the lower insulator 166, the upper insulator 162 further includes a mating tongue 168 on which both contacting sections 170 of the upper contacts 160 and those of the lower contacts 164 are seated on opposite surfaces thereof. The shell 154 defines a receiving cavity 172 into which the mating tongue 168 forwardly extends, and a pair of chamfered structure 172 in compliance with the chamfered structures 120 of the plug connector 110. Understandably, the plug connector 110 is mated within the receptacle connector 150 in a single orientation only due to those chamfered structures 120 and 172.

Referring to FIGS. 36-39 which are derived from the provisional application 61/949,232 and also disclosed in the copending application Ser. No. 14/454,737, the metallic shielding plate 602 of the terminal module assembly 604 of the receptacle connector 600 is mechanically and electrically connected with the metallic latch 612 of the plug connector 610 wherein the terminal module assembly includes the upper part having the upper insulator with the upper contacts, the lower part having the lower insulator with the lower contacts, and the middle part sandwiched between the upper part and the lower part and having the middle insulator enclosing the shielding plate 602.

However, the disclosure is illustrative only, changes may be made in detail, especially in matter of shape, size, and arrangement of parts within the principles of the invention.

What is claimed is:

1. A receptacle connector comprising:
   an insulating housing comprising a base and a mating tongue extending from the base;
   a plurality of upper contacts and a plurality of lower contacts, the contacts comprising plate contacting sections exposed upon opposite upper and lower surfaces of the mating tongue;
   a shielding plate disposed in the mating tongue and the base and isolated from the upper and lower contacts; and
   a metallic shell retained on the base and surrounding the mating tongue to define a mating port which is inserted with a plug connector in either of two insertion orientations, among the metallic shell and the mating tongue;
   wherein the mating tongue defines two opposite lateral sides and a front side connecting with front ends of the two lateral sides thereof, the shielding plate defines corresponding lateral sides and corresponding front side thereof, the front sides of the shielding plate exposed to the front side of the mating tongue and the lateral sides of the shielding plates exposed to the corresponding lateral sides of the mating tongue for protection under an improper angular mating of the plug connector
   wherein the lateral sides of shielding plate slightly protrude beyond the mating tongue, and each of the lateral sides of the mating tongue forms a through notch, which is generally matching with an inflexible locking notch of each of the lateral sides of the shielding plate;
   wherein the shielding plate is embedded in the mating tongue via an insert-molding process, the shielding plate further defines a thinned or even empty front region which is filled with insulative material of the mating tongue after the insert-molding process.

2. The receptacle connector as claimed in claim 1, wherein each said inflexible locking notch is for assure direct locking with a corresponding latch of the plug connector when the receptacle connector is inserted with the plug connector.

3. The receptacle connector as claimed in claim 1, wherein the front side of the shielding plate slightly protrudes beyond the front side of the mating tongue.

4. The receptacle connector as claimed in claim 1, wherein the shielding plate defines two cutouts running through the front side thereof, which are used for aligned with corresponding power contacts of the plug connector.

5. The receptacle connector as claimed in claim 1, wherein the shielding plate defines a lateral and longitudinal thinner region perpendicular to a mating direction of the receptacle connector, at a front portion thereof.

6. The receptacle connector as claimed in claim 1, wherein the shielding plate defines a thinner region extending along a mating direction of the receptacle connector and aligned with high frequent differential pair contacts of the upper and lower contacts to improve impedance control.

7. The receptacle connector as claimed in claim 1, wherein the shielding plate defines a spring tab extending from rear end of the lateral side thereof and elastically touch with an inner of the metallic shell.

8. The receptacle connector as claimed in claim 1, wherein the upper contacts is inserted molded in an upper insulator, the lower contacts is inserted molded in a lower insulator, the shielding plate is inserted molded in a middle insulator, the upper insulator, middle insulator and lower insulator are stackedly assembled together in a direction perpendicular to a mating direction of the receptacle connector.

9. The receptacle connector as claimed in claim 1, wherein the upper contacts are inserted molded in an upper insulator with corresponding contacting sections embedded in the upper insulator, the lower contacts are inserted molded in an lower insulator with corresponding contacting sections embedded in the lower insulator, the shielding plate is wholly sandwiched between the upper insulator and the lower insulator.

10. The receptacle connector as claimed in claim 1, wherein the plug connector comprising an insulative housing with therein a receiving cavity to receive the mating tongue therein, and a pair of laterally deflectable latch arms extending into the receiving cavity to lock with the locking notches, respectively.

11. The receptacle connector as claimed in claim 1, wherein the lower contacts are categorized with short signal contacts and longer power/grounding contacts, middle sections of signal contacts bend toward to adjacent power/grounding contacts to enlarger distance between two adjacent signal contacts.

12. A receptacle connector for mounting to a printed circuit board, comprising:
    a terminal module assembly defined by an upper terminal module and a lower terminal module commonly sandwiching a shielding plate in a vertical direction;
    the upper terminal module including an upper insulator equipped with a plurality of upper contacts, the upper insulator including a rear base and a front tongue, the upper contacts comprising contacting sections embedded in the front tongue and exposed upon an upper surface of the front tongue;
    the lower terminal module including a lower insulator equipped with a plurality of lower contacts, the lower insulator including a rear base and a front tongue, the lower contacts comprising contacting sections embedded in the front tongue and exposed upon a lower surface of the front tongue; and
    a metallic shell retained on the rear bases and surrounding the front tongues to define a mating port which is inserted with a plug connector in either of two insertion orientations;
    wherein the shielding plate is sandwiched between the front tongues and the rear bases of the upper and lower terminal module; wherein
    the shielding plate defines two thinned regions extending a front and rear direction, and the two thinner regions are aligned with differential pair of contacts of the upper and lower contacts;
    wherein lateral sides of the shielding plate slightly protrude corresponding lateral sides of the front tongues of the upper insulator and the lower insulator, the front tongues of the upper insulator and the lower insulator commonly form a through notch in each of said lateral sides of said front tongues, which is generally matching with an inflexible locking notch of each of two lateral sides of the shielding plate.

13. The receptacle connector as claimed in claim 12, wherein one of the upper insulator and the lower insulator defines a pair of posts on a front region thereof, the other of the upper insulator and lower insulator defines a pair of hole, the shielding plate defines two though-holes, the posts go through the through holes and are coupled with the holes.

14. A flappable receptacle connector adapted for mating with a plug connector either in an upside direction or in an upside-down direction which defines a mating slot and a pair of metallic latches with hooks protruding into the mating slot, the receptacle connector comprising:
  an insulating housing comprising a base and a mating tongue extending from the base, the mating tongue intending to insert in the mating slot of the plug connector;
a row of first contacts and a row of second contacts, the contacts comprising plate contacting sections exposed upon opposite surfaces of the mating tongue and leg section extending from the base;
  a shielding plate disposed in the mating tongue and the base and isolated from the first and second contacts; and
  wherein the mating tongue defines two opposite lateral sides and a front side connecting with front ends of the two lateral sides thereof, the shielding plate defines corresponding lateral sides and corresponding front side thereof, the lateral sides of the shielding plates protruding to the corresponding lateral sides of the mating tongue for protection under an improper angular mating of the plug connector;
  wherein each lateral side of the shielding plate define a locking sides for locking with the hooks of the plug connector;
  wherein the lateral sides of the shielding plate slightly protrude beyond the lateral sides of the mating tongue, each of the lateral sides of the mating tongue forms a through notch which is generally matching with an inflexible locking notch in each lateral side of the shielding plate.

15. The flappable receptacle connector as claimed in claim 14, wherein the shielding plate defines two longitudinal thinner regions extending in a mating direction of the receptacle connector and each aligned with a pair of high frequent different signal contacts.

16. The flappable receptacle connector as claimed in claim 14, wherein the shielding plate defines a longitudinal thinner region extending in a direction perpendicular to a mating direction of the receptacle connector at a front edge thereof.

17. The flappable receptacle connector as claimed in claim 14, wherein the shielding plate is mechanically connecting with a metallic shell surrounding the base of the insulating housing.

* * * * *